(12) United States Patent
Ahn

(10) Patent No.: US 11,456,297 B2
(45) Date of Patent: Sep. 27, 2022

(54) SEMICONDUCTOR MEMORY DEVICE, METHOD OF DRIVING THE SAME AND METHOD OF FABRICATING THE SAME

(71) Applicants: SK hynix Inc., Gyeonggi-do (KR); Jin Hong Ahn, Gyeonggi-do (KR); Duality Inc., Daejeon (KR)

(72) Inventor: Jin Hong Ahn, Gyeonggi-do (KR)

(73) Assignees: Jin Hong Ahn, Gyeonggi-do (KR); SK hynix Inc., Gyeonggi-do (KR); Duality Inc., Daejeon (KR)

( * ) Notice: Subject to any disclaimer, the term of this patent is extended or adjusted under 35 U.S.C. 154(b) by 0 days.

(21) Appl. No.: 17/401,601

(22) Filed: Aug. 13, 2021

(65) Prior Publication Data

US 2021/0375871 A1 Dec. 2, 2021

Related U.S. Application Data

(62) Division of application No. 16/366,967, filed on Mar. 27, 2019, now Pat. No. 11,289,486.

(30) Foreign Application Priority Data

Mar. 28, 2018 (KR) .................. 10-2018-0035542

(51) Int. Cl.
| | |
|---|---|
| *G11C 11/40* | (2006.01) |
| *H01L 27/108* | (2006.01) |
| *G11C 11/4093* | (2006.01) |
| *H01L 29/10* | (2006.01) |
| *H01L 29/78* | (2006.01) |

(Continued)

(52) U.S. Cl.
CPC ...... *H01L 27/10802* (2013.01); *G11C 11/404* (2013.01); *G11C 11/4093* (2013.01); *G11C 11/4096* (2013.01); *G11C 11/40611* (2013.01); *H01L 21/0262* (2013.01); *H01L 21/02129* (2013.01); *H01L 21/02236* (2013.01); *H01L 21/28185* (2013.01); *H01L 27/10844* (2013.01); *H01L 29/0847* (2013.01); *H01L 29/1037* (2013.01); *H01L 29/7841* (2013.01); *G11C 2211/4016* (2013.01); *H01L 21/0217* (2013.01);

(Continued)

(58) Field of Classification Search
CPC ............ H01L 27/10802; G11C 11/404; G11C 11/40611; G11C 11/4093
See application file for complete search history.

(56) References Cited

U.S. PATENT DOCUMENTS

| | | | | |
|---|---|---|---|---|
| 2002/0028541 A1* | 3/2002 | Lee | ........................ | H01L 27/115 438/149 |
| 2004/0240273 A1* | 12/2004 | Sakui | .................. | G11C 16/0433 365/185.33 |
| 2009/0290429 A1* | 11/2009 | Dong | .................. | G11C 16/0483 365/185.25 |

\* cited by examiner

*Primary Examiner* — Mohammed A Bashar
(74) *Attorney, Agent, or Firm* — IP & T Group LLP

(57) ABSTRACT

A semiconductor memory device includes a plurality of memory cell transistors arranged along a common semiconductor layer. Each of the plurality of memory cell transistors comprises a first source/drain region and a second source/drain region formed in the common semiconductor layer; a gate stack formed on a portion of the common semiconductor layer between the first source/drain region and the second source/drain region; and an electrical floating portion in the portion of the common semiconductor layer, a charge state of the electrical floating portion being adapted to adjust a threshold voltage and a channel conductance of the memory cell transistor. The plurality of memory cell transistors connected in series with each other along the common semiconductor layer provide a memory string.

10 Claims, 22 Drawing Sheets

(51) Int. Cl.
*G11C 11/4096* (2006.01)
*G11C 11/406* (2006.01)
*H01L 21/02* (2006.01)
*H01L 21/28* (2006.01)
*G11C 11/404* (2006.01)
*H01L 29/08* (2006.01)
*H01L 29/423* (2006.01)

(52) U.S. Cl.
CPC .. *H01L 21/02164* (2013.01); *H01L 21/02255* (2013.01); *H01L 29/42392* (2013.01)

SEMICONDUCTOR MEMORY DEVICE, METHOD OF DRIVING THE SAME AND METHOD OF FABRICATING THE SAME

CROSS-REFERENCES TO RELATED APPLICATION

This application is a division of U.S. patent application Ser. No. 16/366,967 filed on Mar. 27, 2019, which claims benefits of priority of Korean Patent Application No. 10-2018-0035542 filed on Mar. 28, 2018. The disclosure of each of the foregoing application is incorporated herein by reference in its entirety.

BACKGROUND OF THE INVENTION

1. Field

The present invention relates to a semiconductor memory device, and more particularly, to a semiconductor memory device, method of driving the same and method of fabricating the same.

2. Description of the Related Art

A memory cell of a direct random access memory DRAM of a semiconductor memory device may include a switching element for controlling a reading operation/a write operation and a capacitor for storing information. As the DRAM is scale-downed, the area occupied by the capacitors of the memory cells is continuously decreasing. As a technique for securing an effective capacity by compensating a reduced cell area, there has been proposed, for example, a technique of implementing a lower electrode having a 3-dimensional form, such as a cylinder or a fin. As other technique, a method of increasing the height of the lower electrode has been also suggested. However, the latest design rule of 20 nm or less requires that the aspect ratio of the capacitor should be about 25 in order to secure an enough capacitance. It is difficult to implement the harsh design rule easily with the current level of a process technology.

As a new structure of a DRAM memory device capable of increasing the density of integration of the DRAM while overcoming the difficulties in such a fabricating process, a single transistor DRAM device that implements a memory cell using only a single transistor without capacitors is being intensively researched. The operation of the single transistor DRAM element is performed through the steps for storing and reading data by using a floating body effect of an active area of the single transistor.

Even for the single transistor DRAM device having such a new architecture, a scaling down of the device is still required for high-speed and low-power driving, and additionally, a driving method with high reliability is urgently required. If a conventional semiconductor fabricating technology may be applied for the single transistor DRAM device, there is an advantage that mass production of the device may be easily fulfilled.

SUMMARY OF THE INVENTION

It is an object of the present invention to provide a highly integrated DRAM device including a single transistor memory cell in which a capacitor is omitted.

Furthermore, it is another object of the present invention to provide a reliable method of driving the semiconductor memory device.

Furthermore, it is still another object of the present invention is to provide a method of fabricating easily the semiconductor memory device.

In order to solve the above-mentioned technological problems, a semiconductor memory device according to an embodiment of the present invention may include a plurality of memory cell transistors arranged along a common semiconductor layer. Each of the plurality of memory cell transistors may include a first source/drain region and a second source/drain region formed in the common semiconductor layer; a gate stack formed on a portion of the common semiconductor layer between the first source/drain region and the second source/drain region; and an electrical floating portion in the portion of the common semiconductor layer, a charge state of the electrical floating portion being adapted to adjust a threshold voltage and a channel conductance of the memory cell transistor. In addition, the plurality of memory cell transistors may provide a memory string connected in series with each other along the common semiconductor layer.

In one embodiment according to the present invention, a bottom of the common semiconductor layer is insulated so that the non semiconductor layer may have an SOI structure. Both side portions of the electrical floating portion may be electrically insulated by a depletion region formed by a junction interface with the first source/drain region.

In one embodiment according to the present invention, the electrical floating portion may be charged by a GIDL (Gate Induced Drain Leakage) mechanism. In other embodiment according to the present invention, the electrical floating portion may be charged by an impact-ionization mechanism.

The semiconductor device may further include a row buffer memory for backing up a data state of each the plurality of memory cell transistors. The common semiconductor layer may be provided by a semiconductor pillar structure extending in a direction perpendicular to the substrate. In one embodiment according to the present invention, the common semiconductor layer may have a hollow cylinder structure, and the inner portion of the cylinder structure is filled with an insulator plug.

In one embodiment according to the present invention, the electrical floating portion includes a charge trap member. The charge trap member may include a grain boundary of a semiconductor material, nanocrystal, a two-dimensional material an insulator thin film, a detect structure, or a combination thereof.

In order to solve the above-mentioned technological problems, a semiconductor memory device according to an embodiment of the present invention may include memory strings, each of them including a plurality of memory cell transistors connected in series; word lines coupled to gate electrodes of each of the plurality of memory cell transistors; bit lines connected to one end of each of the memory strings; source lines connected to other end of each of the memory strings; a row decoder electrically connected to the plurality of memory cell transistors through the word lines; and a column decoder electrically coupled to the plurality of memory cell transistors through the bit lines.

The plurality of memory cell transistors may be spaced apart in a first direction and in a second direction different from the first direction on a substrate and may be formed along a common semiconductor layer perpendicularly extending o the substrate. Each of the plurality of memory cell transistors may include a first source/drain region and a second source/drain region formed in the common semiconductor layer; a gate stack formed on a portion of the common semiconductor layer between the first source/drain region and the second source/drain region and is coupled to each of the word lines; and an electrical floating portion which is defined in the portion of the common semiconductor layer and adjusts at least one of a threshold voltage of the memory cell transistor and a conductance of the channel according to a charged state.

Both side portions of the electrical floating portion may be electrically insulated by a depletion region formed by a junction coupling with the first source/drain region. In one embodiment according to the present invention, the electrical floating portion may be charged by a GIDL (Gate induced Drain Leakage) mechanism. In other embodiment according to the present invention, the electrical floating portion may be charged by an impact-ionization mechanism.

In one embodiment according to the present invention, the semiconductor memory device may further include a row buffer memory for backing up a data state of each the plurality of memory cell transistors. In one embodiment according to the present invention, an array of the row buffer memories may provide a row buffer memory layer, and a memory cell array including the memory strings may have a layer structure separated from the row buffer memory layer.

The common semiconductor layer may be provided by a semiconductor pillar structure extending in a direction perpendicular to the substrate. In one embodiment according to the present invention, the common semiconductor layer has a hollow cylinder structure, and the inside portion of the hollow cylinder structure is filled with an insulator plug.

In one embodiment according to the present invention, the electrical floating portion may include a charge trap member. The trap member may include a grain boundary of a semiconductor material, nanocrystal, a two-dimensional material an insulator thin film, a defect structure, or a combination thereof.

In order to solve the above-mentioned technological problems, a semiconductor memory device according to an embodiment of the present invention may be provided. The semiconductor memory device comprises memory strings, each of them including a plurality of memory cell transistors which are connected in series and having a floating portion; word lines coupled to a gate electrode of each of the plurality of memory cell transistors; bit lines connected to one end of each of the memory strings; source lines connected to other end of each of the memory strings; a row decoder electrically connected to the plurality of memory cell transistors through the word lines; and a column decoder electrically coupled to the plurality of memory cell transistors through the bit line.

According to the drive method of a semiconductor memory device, a programming step including a step for applying a first driving voltage to a selected bit line, and a step for applying a second driving voltage less than the first driving voltage to non-selected bit lines or grounding the non-selected bit lines, and a step for applying a program voltage to the selected word line and applying a first pass voltage to the unselected word lines; a step for applying a third driving voltage to the selected bit line and for applying a fourth driving voltage to the non-selected bit lines or grounding the non-selected bit lines; and a step for applying a reading voltage to the selected word line and for applying a second pass voltage to the unselected word lines may be performed.

During the programming step, the first pass voltage may include a high-pass voltage applied to the word lines on the selected bit line side among the non-selected word lines, and a low-pass voltage smaller than the high-pass voltage applied to the word lines on the source line side of the unselected word lines. In one embodiment according to the present invention, during the reading step, the third driving voltage and the fourth driving voltage may be identical or the fourth driving voltage may be less than the third driving voltage. In one embodiment according to the present invention, the second driving voltage and the fourth driving voltage may be identical. During the programming step, the floating portion may be charged by the GIDL mechanism.

In one embodiment according to the present invention, an erasing step including a step for applying a fifth negative driving voltage to the selected bit line and for applying a sixth positive driving voltage to the unselected bit lines; and step for applying a third pass voltage to all the word lines may be performed. In one embodiment according to the present invention, the third pass voltage may have the same value as that of the first pass voltage or the second pass voltage.

In one embodiment according to the present invention, a step for backing up data state of the non-selected memory cell transistor belonging to the selected memory string prior to the erasing step may be additionally performed. In this case, the step for backing up data state may be performed by a row buffer memory. In one embodiment according to the present invention, a refresh step of reading data state of the memory cell transistors at a predetermined period and programming the memory cell transistors may be performed additionally.

In order to solve other technological problems, a method for fabricating a semiconductor memory device according to an embodiment of the present invention may include a step for providing a substrate; a step for repeatedly alternately stacking an impurity-containing insulating layer and a sacrificial layer for a dopant on the substrate; a step for forming semiconductor pillars passing through the impurity insulating film and the sacrificial layer repeatedly stacked in a vertical direction, arranged in a first direction parallel to the substrate and in a second direction different from the first direction and extending in a direction perpendicular to the substrate; a step for forming a first trench region extending in the first direction and the vertical direction to form a stacked structure of an impurity-containing insulating layer pattern and a sacrificial layer pattern in the repeatedly alternately stacked structure of the impurity-containing insulating layer and the sacrificial layer, so as to the semiconductor columns pillars arranged in the second direction within the stacked structure of the impurity-containing insulating layer and the sacrificial layer, a step for removing the sacrificial layer pattern from the stack structure of the impurity-containing insulating layer pattern and the sacrificial layer pattern exposed through the first trench region to expose the surfaces of the semiconductor columns between the impurity-containing insulating layer patterns; a step for forming a gate insulating film on the exposed surfaces of the exposed semiconductor pillars by a heat process on the exposed surfaces, and for forming a source/drain region by doping impurities into a region of the semiconductor pillars where the impurity-containing insulating layer patterns are in contact with; and a step for forming a conductive film filling at least a part of the cell spaces in which the gate insulating film is formed.

The impurity-containing insulating layer may include an insulator matrix or a dopant element contained in the insulator matrix. The dopant element may be physically dispersed or chemically combined in the insulator matrix. In other embodiments according to the present invention, the dopant element may be physically or chemically adsorbed or coated on a surface of the insulator matrix. In one embodiment according to the present invention, the impurity-containing insulating layer may include PSG (a phosphoric silicate glass).

In one embodiment according to the present invention, the step for forming the semiconductor pillars may be realized by a step for forming first holes passing through the stack of the repeatedly stacked insulating films and the sacrificial layer; and a step for forming a semiconductor layer in the first holes. In one embodiment according to the present invention, the step for filling second holes defined by the semiconductor layer with a core insulator may be performed.

The heat process may be performed under an oxidizing atmosphere, and the gate insulating film may be formed by thermally oxidizing the surface of the semiconductor pillars. A floating portion for information storage may be formed between the source/drain regions adjacent to the regions of the semiconductor pillars under the conductive film. In one embodiment according to the present invention, a step for forming an electrical wiring on other end of the semiconductor pillars may be performed additionally.

The electrical floating portion may include a charge trap member. The trap member may include a grain boundary of a semiconductor material, nanocrystal, a two-dimensional material an insulator thin film, a defect structure, or a combination thereof.

According to the embodiment of the present invention, since a DRAM device using a single transistor without a capacitor is realized by a structure in which the memory cell transistors having a floating portion for storing information are connected in series, a semiconductor device with a highly integration, high-speed and low-power consumption can be provided.

Furthermore, according to an embodiment of the present invention, there is provided a method of driving a semiconductor memory device which may perform random access to serially connected memory cells and thereby, may implement DRAM operations through which a reliable programming, reading, erasing, and correction operations may be executed.

In addition, according to the embodiment of the present invention, there is provided a method of fabricating a semiconductor memory device which can secure mass production easily by employing a conventionally established three-dimensional NAND flash memory technology as a DRAM fabricating technology.

DETAILED DESCRIPTION OF THE INVENTION

Figure 1A:
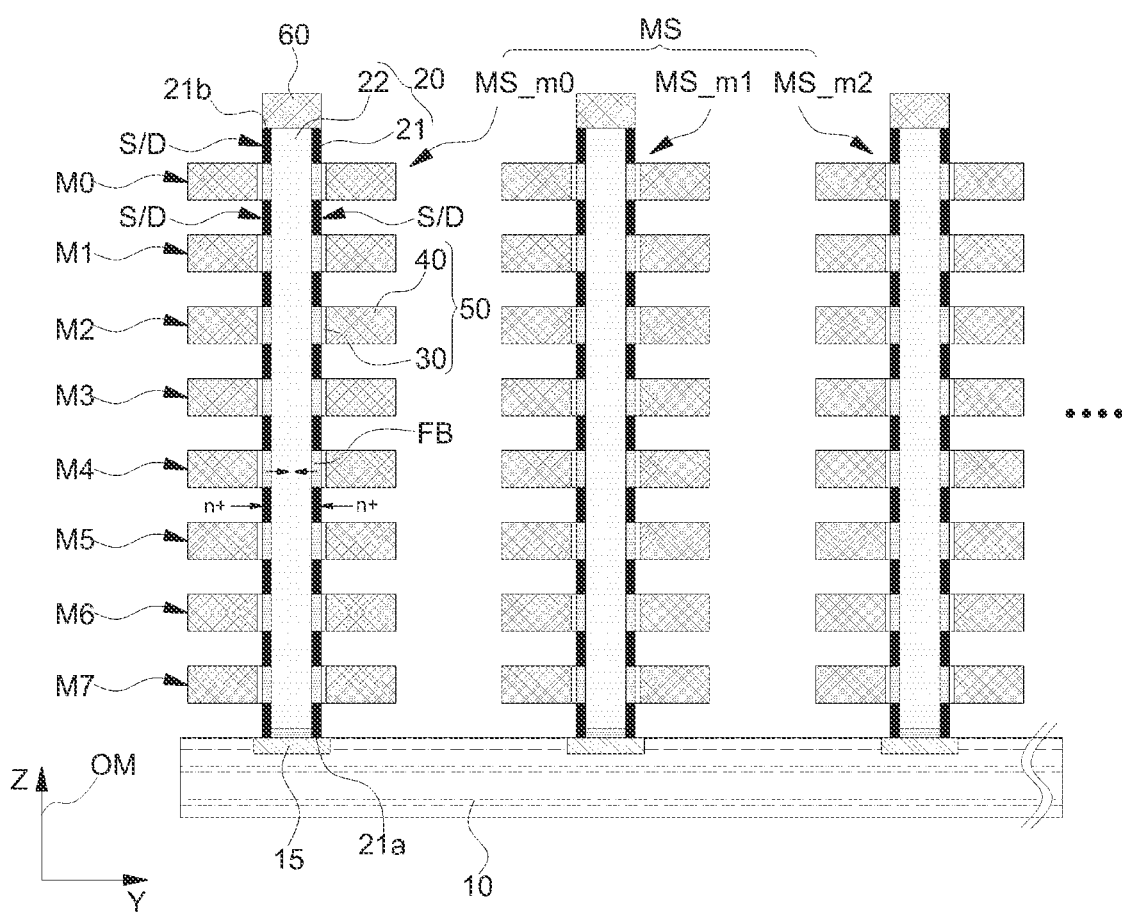
FIG. 1A is a cross-sectional diagram of memory strings of a semiconductor memory device according to an embodiment of the present invention and FIG. 1B is a circuit diagram illustrating a memory cell array including memory strings.

Hereinafter, the preferred embodiments of the present invention will be described in detail with reference to the accompanying drawings.

The embodiments of the present invention are provided so that the scope and the spirits of the present invention may be explained more completely and accurately to those having a common knowledge in the related art. The following embodiments may be modified in various other forms, and the scope of the present invention is not limited to the following embodiments. Rather, these embodiments are provided so that this disclosure may be explained more faithfully and completely, and may be described to fully convey the concept of the invention to those skilled in the art.

In the drawings, the same reference numerals refer to the same elements. Also, as used herein, the term, "and/or" includes any one or all combinations of more than one item among the listed items.

The terms used herein are used to illustrate the embodiments and are not intended to limit the scope of the invention. Also, although a terminology is described in the singular form in this specification, unless the context clearly indicates the singular form, the singular form may include plural forms. Further, it is to be understood that the term, "comprise" and/or "comprising" used herein should be interpreted as specifying the presence of stated shapes, numbers, steps, operations, members, elements and/or a group thereof, and does not exclude the presence or addition of other features, numbers, operations, members, elements, and/or groups thereof.

Reference herein to a layer formed "on" a substrate or other layer may refer to a layer formed directly on top of the substrate or other layer, or to a middle layer formed on the substrate or other layer, or a layer formed on middle layers. It will also be understood by those skilled in the art that structures or shapes that are arranged in an "adjacent"

manner to other features may have portions that overlap or are disposed below the adjacent features.

As used herein, the terms, "below," "above." "upper," "lower," "horizontal," or "vertical" may be used to describe the relationships between one configuring member, layer or region; and other configuring member, layer or region as shown in the drawings. It is to be understood that these terms are employed to encompass the different directions of the device as well as the directions indicated in the drawings.

In the following descriptions, the embodiments of the present invention will be explained with reference to cross-sectional diagrams schematically illustrating ideal embodiments (and intermediate structures) of the present invention. In these drawings, for example, the size and shape of the members may be exaggerated for convenience and clatity of description, and in actual implementation, variations of the illustrated shape may be expected. Accordingly, the embodiments of the present invention should not be construed as being limited to the specific shapes of the regions shown herein. In addition, the reference numerals of members in the drawings refer to the same members throughout the drawings.

Figure 1B:
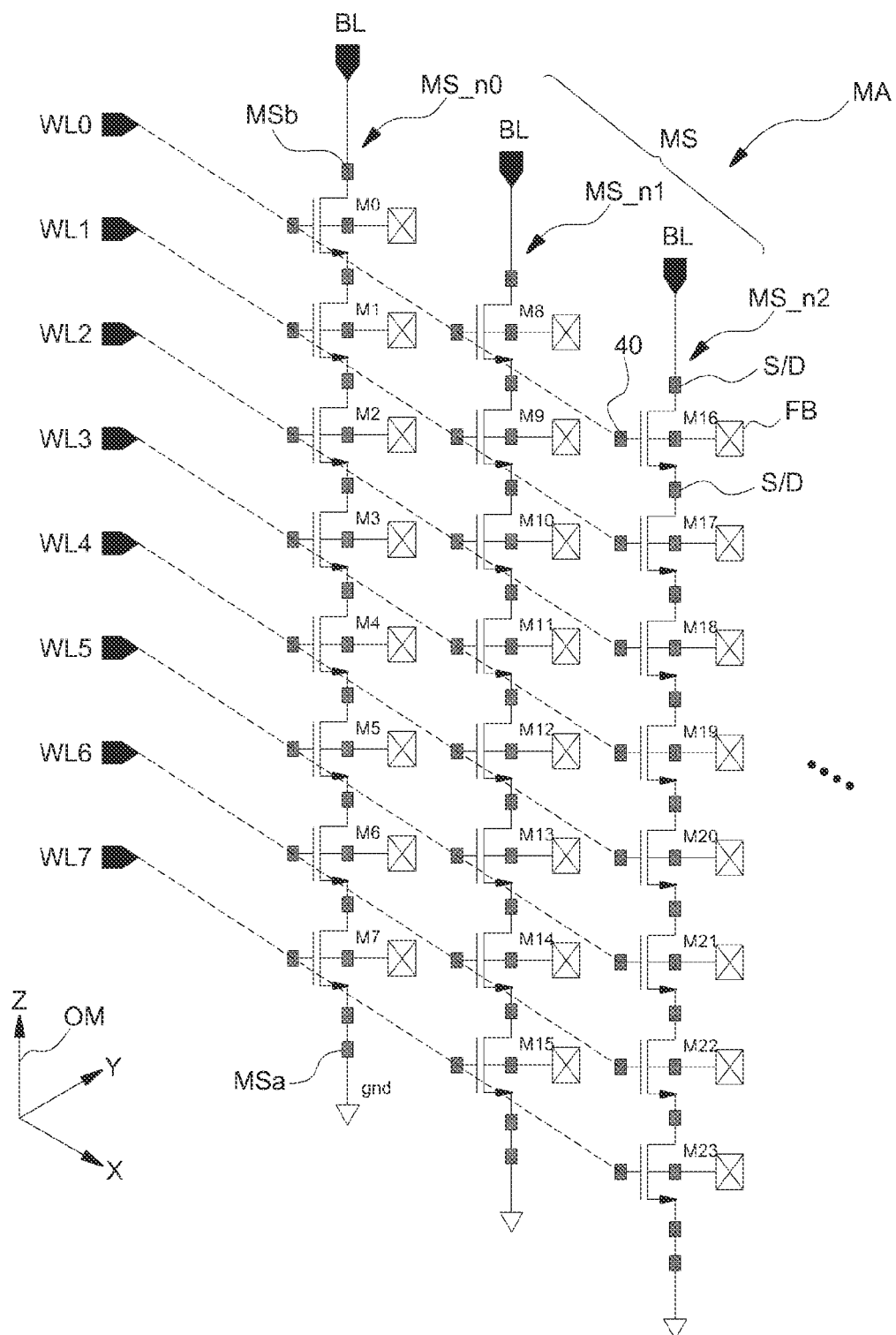

FIG. 1A is a cross-sectional diagram of memory strings MS (MS0-MS2) of a semiconductor memory device according to an embodiment of the present invention, and FIG. 1B is a circuit diagram illustrating a memory cell array MA including memory strings MS (MS0-MS2).

Referring to FIG. 1A and FIG. 1B, a memory cell array if may include at least one memory strings MS (MS0-MS2) in which a plurality of memory cells M0-M23 are connected in series. For example, the plurality of memory strings MS may be arranged in a plane in the row direction (x-axis direction) and the column direction (Y-axis direction) within a space that may be specified according to the coordinate system OM. Alternatively, the plurality of memory strings MS may be arranged vertically as well as in the plane in the row direction (x-axis direction) and the column direction (Y-axis direction) within the space that may be specified according to the coordinate system OM. The X axis direction and the Y axis direction may be orthogonal or have any acute angle, for example, 60° and any obtuse angle, for example, 120°. In addition, the memory strings MS are linearly arranged along the x-axis or the y-axis, or may be arranged in any regular meander pattern. However, the embodiments of the present invention are not limited thereto.

The memory strings MS may include a common semiconductor layer 21 extending vertically to the substrate 10. A plurality of memory cells M1-M23 may be connected in series with each other through the common semiconductor layer 21. In FIGS. 1A and 1B, a configuration in which the memory cell transistors M0-M7; M8-M15; M16-M23 for constituting each of memory cells are connected in series are illustrated as an example. The number (in other word, stage) of the memory cell transistors may be any number, such as, for example, 32, 48, 64, 72, 96 and 128, which may be appropriately selected by considering the required memory capacity, yield, and/or the total resistance connected in series, and the present invention is not limited thereto.

In order to provide the common semiconductor layer 21, a semiconductor column structure 20 for providing a channel layer of a conventional three-dimensional vertical NAND flash memory may be employed. For example, channels of the memory strings (MS, MS0-MS2) may be provided by the common semiconductor layer 21 of the semiconductor column 20 including the common semiconductor layer 21 and the insulator plug 22 filling the inside of the common semiconductor layer 21. In this case, the common semiconductor layer 21 may have a vertically elongated cylindrical shape from the main surface of the substrate 10. An inner side part of the common semiconductor layer 21 contacts with the insulator plug 22 and thus, is electrically insulated by the insulator plug 22, so that the plurality of memory cell transistors M0-M7; 8-M15; M16-M23 may have an active region such as a silicon-on-insulator SOI with suppressed semiconductor body effect. In another embodiment, the insulator plug 22 may be omitted. this case, the common semiconductor layer 21 may have a vertically elongated solid cylinder shape formed fully from a semiconductor material.

The common semiconductor layer 21 may be a silicon-based semiconductor material such as silicon single crystal, polysilicon or silicon carbide; a compound semiconductor such as GaAs, GaF, or InP; a two-dimensional semiconductor material such as graphene or molybdenum sulfide; an oxide semiconductor such as a zinc oxide or indium tin oxide; or a combination such as a mixture: of these materials; or laminate structure of these materials, but the present invention is not limited thereto. In one embodiment, a trap element may be further formed to induce a charge trapping to extend the time of leakage of electrons or holes charged in the floating body or increase the charge efficiency, as described later. The trap element may be, for example, a grain boundary of a semiconductor material, a defect structure, a dispersed nanocrystal, a two-dimensional material such graphene, an insulator thin film such as a silicon nitride layer, or a combination thereof. The trap element may provide any energy level for trapping charges transferred from the source/drain regions, and the present invention is not limited to the above-described materials.

A thickness of the common semiconductor layer 20 having a hollow cylinder shape or a diameter of the common semiconductor layer in the shape of a hollow cylinder which are already mentioned in the foregoing paragraphs may be appropriately selected in order to obtain an electric floating effect described later, and the present invention is not limited thereto.

The plurality of memory cell transistors M0-M7; M8-M15; M16-M23 may include a first and second source/drain regions S/D, and a gate stack having a gate insulating film 30 and a gate electrode 40 between the first source/drain region SD and the second source/drain region S/D, respectively, The surface region of the common semiconductor layer 21 in contact with the lower portion of the gate insulating film 30 becomes a channel region of each memory cell transistor M0-M7; M8-M15; M16-M23. A floating portion FB may be provided below the channel region of the common semiconductor layer 21. In one embodiment, the floating portion FB may be formed between neighboring source/drain regions S/D of each of the memory cell transistors M0-M7; M8-M15; M16-M23 indicated by a dotted line.

The side surface of the floating portion FB of each memory cell transistor M0-M7; M8-M15; M16-M23 may be electrically insulated by a depletion region formed by a junction interface with the first and second source/drain regions. For example, when each of the memory cell transistors M0-M7; M8-M15; M16-M23 is an N type transistor, the source/drain regions S/D are N type high concentration impurity regions. When the channel region and the floating portion FB are a P type impurity or an intrinsic semiconductor, the side surface of the floating portion FB may be electrically insulated by the junction interface. Further, since the bottom surface of the floating portion FB is in contact with the insulator plug 22 when the common semiconductor layer 21 has a hollow cylinder shape and the hollow inner region is filled with the insulator plug 22, the bottom surface of the floating portion FB may be electrically isolated. In the case where the common semiconductor layer 21 has a columnar shape, an electrical isolation may be achieved only if the entire side surface of the floating portion FB has the depletion region by the junction interface, In this way, the electrical isolation of the floating portion FB due to the adjacent source/drain regions S/D, may be achieved since the depth of the source/drain regions S/D enables impurities to be doped deeper as compared with the depth of the channel region of the memory cell transistors M0-M7; M8-M15; M16-M23. In one embodiment, the depth of the source/drain regions S/D may correspond to the total thickness of the common semiconductor layer 21. As a result, each of the memory cell transistors M0 to M7 (M8 to M15; M16 to M23) implements a four-terminal MOSFET composed of the first and second source/drains S/D, the gate electrode 40, and a floating portion FB as shown in FIG. 1B.

Electrical insulation or isolation of the floating part FB from the surroundings permits a slight degree of insulation or isolation, without limited to a complete insulation or isolation. The slight degree of insulation or isolation means that data stored in the form of charges in the floating portion FB due to an electrical leak may be destroyed in the form of a leakage current and before the stored data is completely destroyed, a refresh operation of a typical DRAM device, which is a repetitive process of reading and rewriting stored data can be performed.

The first end 21a of the common semiconductor layer 21 may be electrically connected to the first conductive member 15 on the side of the substrate 10 and the second end 21b is electrically connected to the second conductive member 60. In one embodiment, the first conductive member 15 may be one electrode of a switching element (not shown) for selection of a memory string MS, or a conductive electrode that is electrically connected to one electrode of the switching element. However, this is an exemplary case, and the first conductive member may be any conductors such as a wiring member itself for connection to a source line, a source line contact, and another memory string, one end of a switching element or logic element, or an electrode connected to one end of a switching element or logic element, a contact, a plug, or rewiring.

In one embodiment, the second conductive member 60 may be a wire, e.g., a bit line, for reading data of a selected memory cell transistor. However, this is only an exemplary case. Similar to the first conductive member described above, the second conductive member 60 may be any conductors such as a wiring member itself for connection with another circuit member, one end of the switching element or the logic element, or an electrode connected to one end of the switching element or the logic element, a contact, plug, or a rewiring, and the present invention is not limited thereto. In FIG. 1B, a first end MSa of the common semiconductor layer 21, i.e., a memory string MS_n0, MS_n1, MS_n2 provided thereby is connected to a source line (not shown) and/or to a ground. A second end MSb are connected to the bit lines BL0, BL1 and BL2. Accordingly, the memory strings MS0, MS1 and MS2 in which a plurality of memory cells M0-M7; M8-M15; M16-M23 each having a floating body between the source line and the bit line are connected in series may be implemented.

The serially connected memory cells have a structure similar to that of a memory string of a NAND flash memory device. However, the serially connected memory cells are capable of random access like conventional DRAMs. In an embodiment of the present invention, since memory cells in series have one bit line contact, as compared to a structure in which each memory cell has a bit line contact as in the case of the memory cells connected in parallel or a NOR type array, the parasitic capacitance of a bit line may be reduced. In addition, according to the embodiment of the present invention, the sensing current may increase due to the decrease of the parasitic capacitance and thus, the sensing margin may be improved.

The gate electrode 40 of each memory cell transistor may be electrically connected to the word lines WL0 to WL7. Each of the bit lines WL0 to WL7 may be integrated with the gate electrode 40 of each memory cell transistor, but the present invention is not limited thereto. The gate electrode 40 may have a GAA (Gate-All-Around) shape surrounding the common semiconductor layer 21 of each memory cell region. The word lines WL0 to WL7 may extend, for example, in the X direction and intersect the bit lines BL0 to BL2 extended in the Y direction. The memory cells may be selected by selecting the word lines WL0 to WL7 and the bit lines BL0 to BL2 which intersect with each other.

Although the embodiment shown in FIG. 1A relates to a three-dimensional semiconductor device in which a common semiconductor layer is vertically extended on a substrate, the common semiconductor layer may be horizontally extended to the substrate, and the horizontally extended common semiconductor layer may be vertically laminated to a substrate in order to realize a three-dimensional DRAM device. One end of the horizontally extended common semiconductor layer may be connected to each other by a conductive plug, but the present invention is not limited thereto.

Figure 2A:
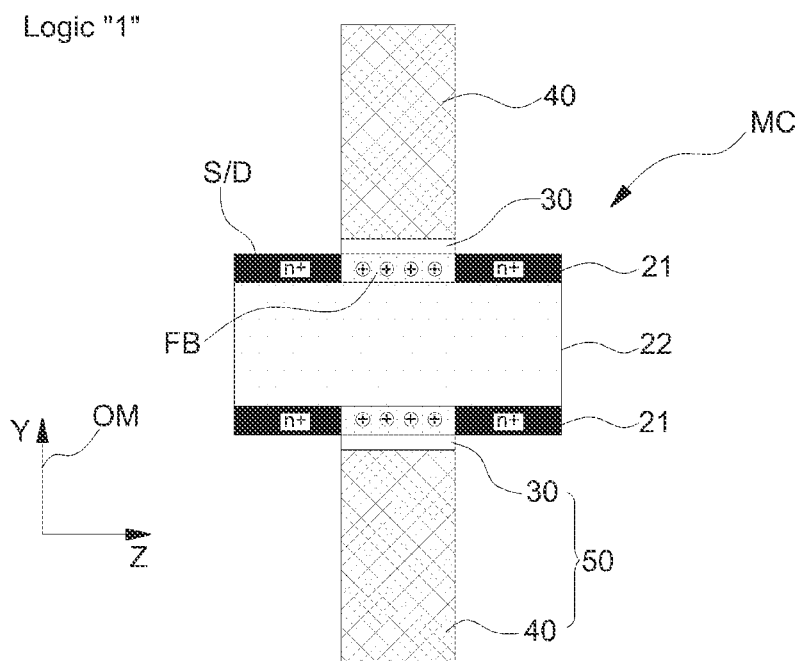
FIGS. 2A and 2B are cross-sectional diagrams illustrating a logic state of a memory cell transistor MC according to an exemplary embodiment of the present invention.
Figure 2B:
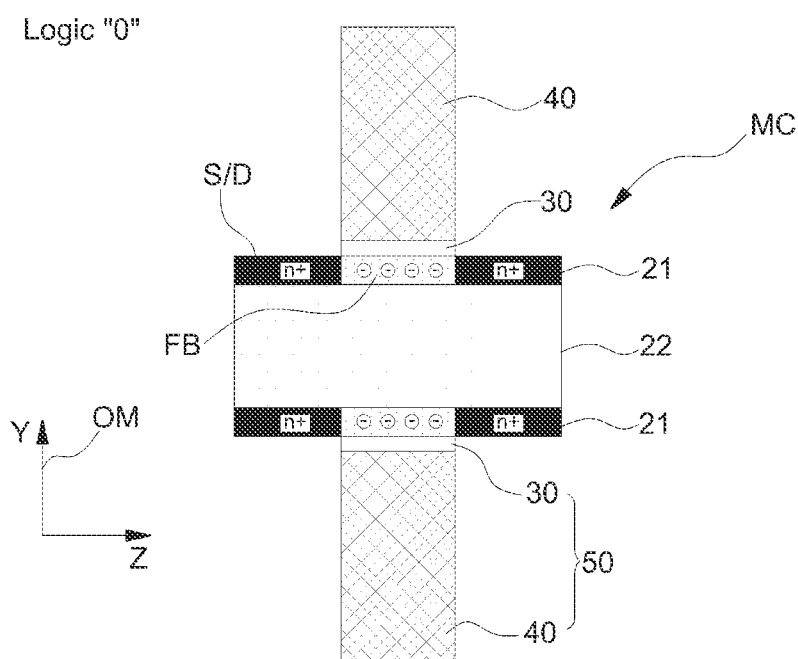
Figure 3:
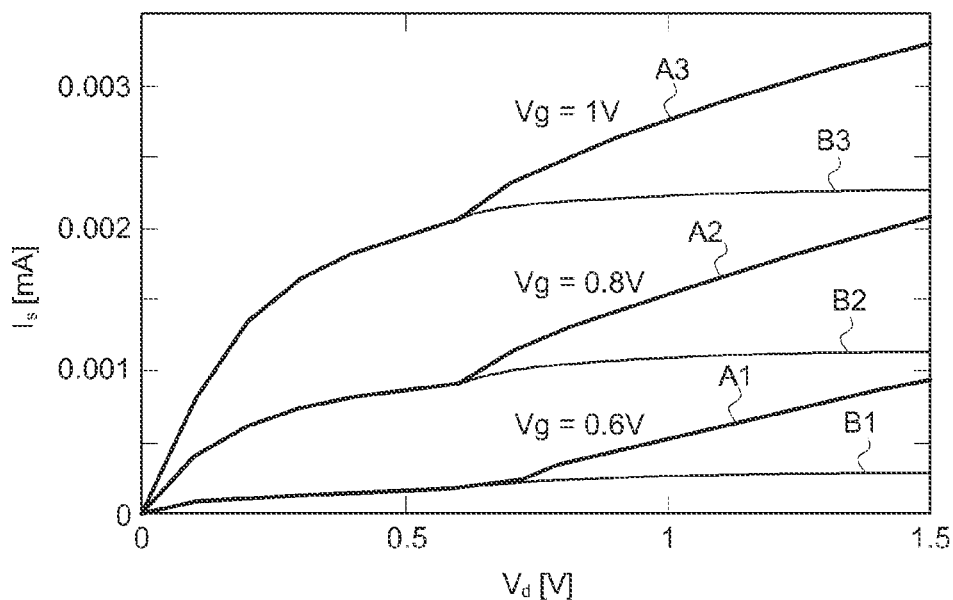
FIG. 3 is a graph illustrating an I-V characteristic change according to a logic state of a memory cell transistor.

FIG. 2A and FIG. 2B are cross-sectional diagrams illustrating a logic state of a memory cell transistor MC according to an exemplary embodiment of the present invention, and FIG. 3 is a graph illustrating an I-V characteristic change according to a logic state of a memory cell transistor.

Referring to FIG. 2A and FIG. 2B, the threshold voltage of the memory cell transistor MC or the conductance of the channel is varied depending on whether the floating portion FB of the memory cell transistor MC is charged or not. That is, depending on whether the charge is injected into the floating portion FB or is eliminated, "1" or "0" may be stored. FIG. 2A shows a case where the floating portion FB charged with excessive holes (+ charge) corresponds to a logic "1" and FIG. 2B shows a case where the floating portion FB charged with electrons corresponds to "0". In another embodiment, the case where the hole is charged may correspond to the logic "0", and the case where the electron is charged may correspond to the logic "1".

In FIG. 3, the curves A1 to A3 show the I-V characteristics of the memory cell transistors corresponding to the logic "1" where holes are charged in the floating portion, and the curves B1 to B3 correspond to the logic "0" where electrons are charged in the floating portion. It is confirmed that the current Is of the memory cell transistor in the logic "1" state is larger than the current Is of the memory cell transistor in the logic "0" state, at the constant drain voltage Vd and the constant gate voltage Vg. As the gate voltage Vg is increasing, the the current Is at the same drain voltage Vd is greater.

As described above, the current output value of the memory cell transistor changes depending on whether the floating portion is charged or not, and polarities of a charge, so that it may be applied as a memory device. Further, as described above, since the threshold voltage or the conductance of the channel is changing according to the sign and/or the charge amount of the electric charge charged in the floating portion FB, it is not limited to binary states such as logics "0" and "1". Logic states for multi-bit implementations having more than 2 bits may be implemented. Charging of the floating portion may be achieved by intentionally injecting or removing charges for the floating portion. In this specification, the operation for injecting charges to the floating portion is referred to as a recording operation and the operation for removing charges may be referred to as an erasing operation. These operations will be described in detail later.

Since the electric charges injected into the floating portion are incompletely electrically isolated as described above, the charges may be diffused and leaked to the adjacent first and second source/drain regions S/D over time, or may flow into the insulator plug 22 and may dissipate. As described above, the charges injected into the floating portion undergo a natural decay over time, which means that the data stored in the memory cell is lost. A periodic refresh operation may be performed in order to prevent the data from being lost and to maintain the data stored in the memory cell transistor. The refresh operation will be described later in detail with reference to FIG. 10.

Figure 4:
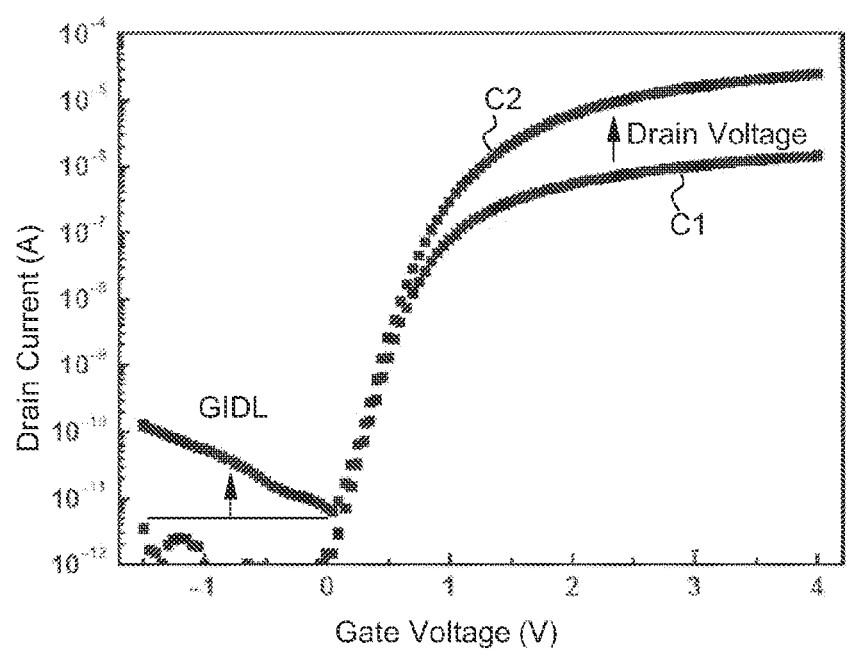
FIG. 4 is a graph illustrating characteristics for explaining a programming operation of a memory cell transistor according to an embodiment of the present invention.
Figure 5A:
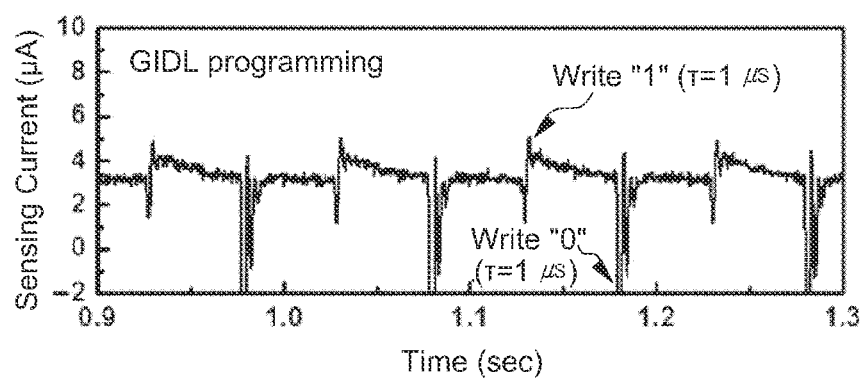
FIGS. 5A and 5B are graphs for explaining characteristics according to various embodiments of the present invention.
Figure 5B:
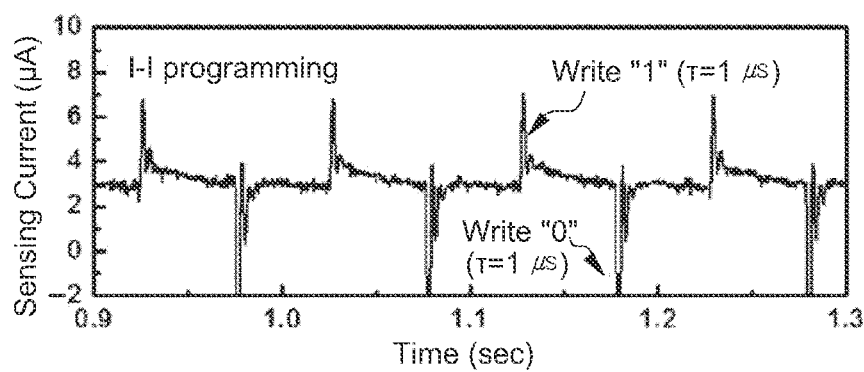

FIG. 4 is a graph illustrating I-V characteristics for explaining a programming operation of a memory cell transistor according to an embodiment of the present invention. FIGS. 5A and 5B are graphs for explaining I-V characteristics according to various embodiments of the present invention.

Referring to FIG. 4, a programming operation of a memory cell transistor according to an embodiment of the present invention may be explained. The measured memory cell transistor is related to an N-type memory cell transistor whose active layer is made of polysilicon and is extracted from a dissertation, "Capacitorless 1T-DRAM on Crystallized Poly-Si TFT", which was published in the Journal of Nanoscience and Nanotechnology, Vol. 11, pp, 5608 to 5611, and was co-authored by Min Soo Kim and Won Ju Cho.

If the N-type memory cell transistor is programmed with a positive charge as described below, the threshold voltage may be reduced. When the N-type memory cell transistor is programmed with a negative charge, the threshold voltage may increase.

The evaluated memory cell transistor relates to an N-type memory cell transistor. However, the present invention is not limited to this, and a P-type memory cell transistor is also included within the scope of the present invention. In the case of a P-type memory cell transistor, the behavior opposing to the polarity of the N-type memory cell transistor may be observed. For example, the threshold voltage may be increased if the P-type memory cell transistor is programmed with a positive charge, and the threshold voltage may be decreased when the P-type memory cell transistor is programmed with a negative charge.

Under the state where the source electrode of the measured N-type memory cell transistor is grounded and 0.1 V (curve C1) and 1 V (curve C2) are applied to the drain electrode and the drain electrode, respectively, when a negative voltage is applied to the gate electrode as shown in FIG. 4, a large electric field is formed between the gate electrode and the drain electrode. As a result, a leakage current due to a GIDL (Gate Induced Drain Leakage) mechanism is generated from the drain electrode toward the source electrode, and a charge, for example, a hole may be charged in the floating portion of the memory cell transistor or an electron may flow out toward the drain electrode because of the leakage current. A charging due to GIDL is increasing as the drain voltage is increasing. In this way, the leakage current caused by the GIDL mechanism occurring in a memory cell transistor may be applied to a programming operation of a memory cell transistor, that is, an operation for charging the floating portion.

In another embodiment, the programming operation for charging the floating portion may be performed by an impact-ionization (I-I) mechanism in addition to the GIDL leakage current effect described as above. For example, when the gate electrode is grounded and a high voltage bias is applied to the drain electrode, a current may flow from the drain electrode toward the source electrode, and this current may be used as a current for charging the floating portion.

Referring to FIG. 5A, in the case of the memory cell transistor programmed by the GIDL mechanism, there is a current level difference of about 3 µA or more between the sensing current (the time constant τ is 1 µs) of the logic state "1", and the sensing current (the time constant τ is 1 µs) of the logic state "0". Since the logic state "1" has a predetermined retention time, it is confirmed that a refresh operation having a period shorter than the retention time is necessary in consideration of this situation. The data retention time may be adjusted according to materials, designs, and/or a refresh period setting of the memory cell transistor, and thus the present invention should not be limited thereto.

Referring to FIG. 5B, a difference in sensing current is occurring between the logic "1" and the logic "0" even in the memory cell transistor programmed by the I-I mechanism and the data retention time is also found to be similar to that of the GIDL mechanism. It may be appreciated that a large current instantaneously flows during a programming operation since a high voltage bias is applied to the drain electrode, but the level difference of the sensing current in both data states is reduced to less than 2 µA, which is smaller than the current level difference in the GIDL mechanism.

The measured results illustrated in FIG. 5A and FIG. 5B relate to the case where the common semiconductor layer is formed of polysilicon rather than single crystal silicon. Even in this case, it may be understood that a DRAM device using a floating body effect may be realized.

In the case of the program driving due to a process for charging a floating portion according to the GIDL mechanism and the I-I mechanism described above, the programming operation using the GIDL mechanism is more preferable than the programming operation using the I-I mechanism in terms of a sensing margin. At the same time, in the NAND type memory structure, the programming operation using the GIDL mechanism has an advantage simplifying the cell selection scheme as disclosed with reference to FIG. 6 in that one memory cell transistor may be selected by combining the gate voltage WL and the drain voltage BL. the programming operation using the 14 mechanism may require a somewhat complicated gate voltage WL drive because there is a case that the voltages applied to the gate electrode of the memory cell transistor selected for the program and the gate electrode of the non-selected memory cell transistor must be grounded. Therefore, application of the general cell selection scheme may be relatively difficult as compared to that of the GIDL mechanism.

Figure 6A:
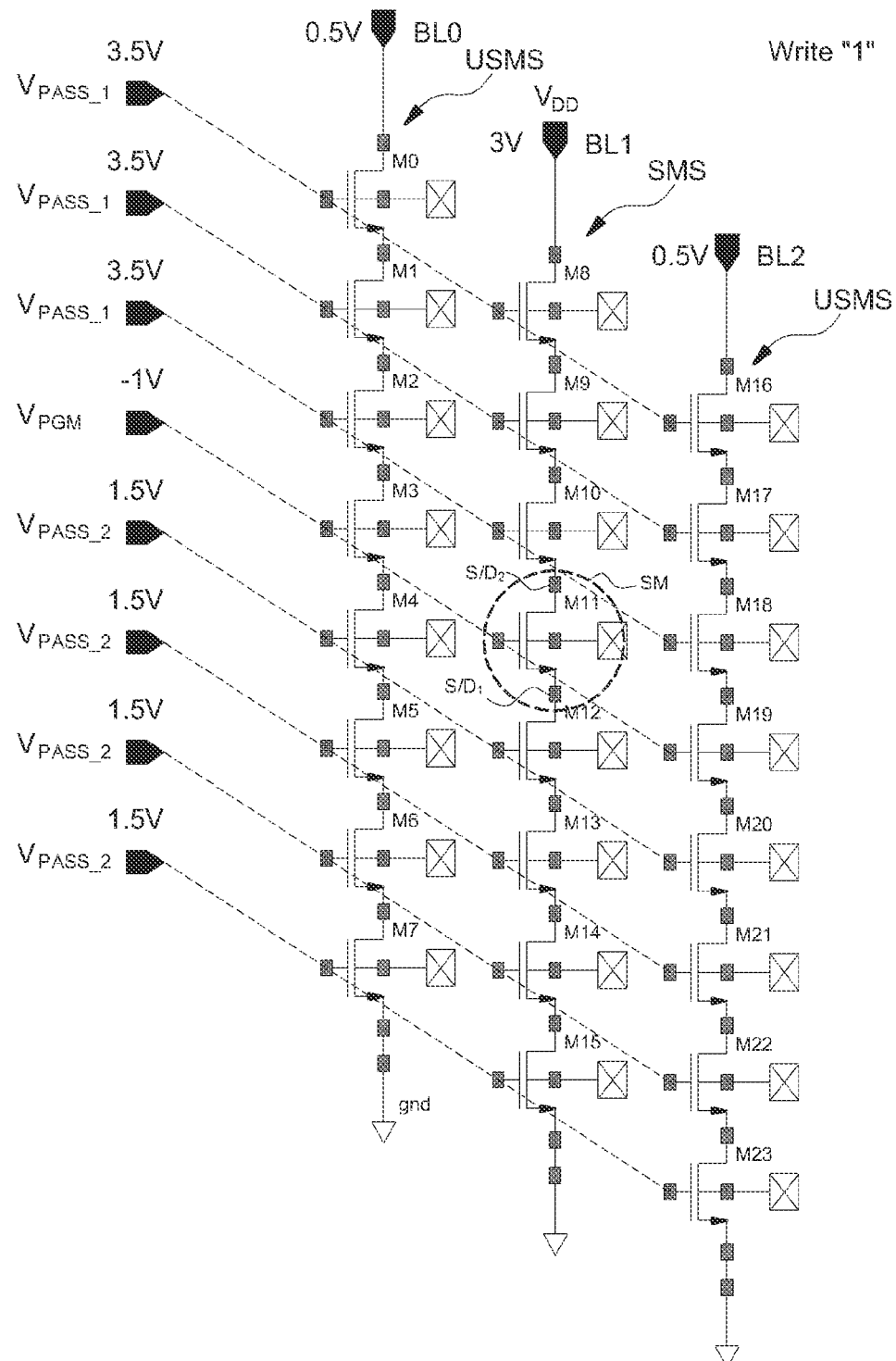
FIG. 6A is a circuit diagram illustrating a method of programming a memory cell transistor according to an embodiment.
Figure 6B:
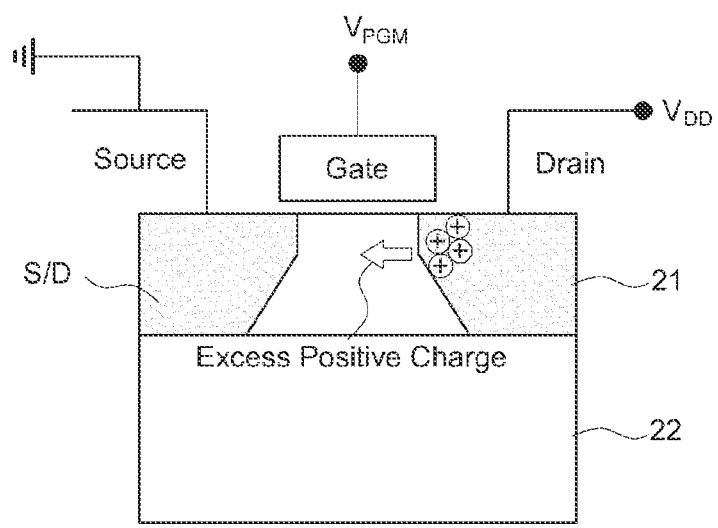
FIG. 6B is a cross-sectional diagram schematicaly illustrating a programming operation of a selected memory cell transistor.

FIG. 6A is a circuit diagram illustrating a method of programming a memory cell transistor according to an embodiment, and FIG. 6B is a cross-sectional diagram schematically illustrating a programming operation of a selected memory cell transistor.

Referring to FIG. 6A and FIG. 6B, a relatively large amount of the first driving voltage VDD for induction of the GIDL mechanism, for example, a large voltage of 3 V is applied to a bit line BL1 of the memory string SMS to which the selected memory cell transistor SM shown by the dotted circle belongs, and the bit lines BL0 and BL2 of the non-selected memory string USMS are grounded or a second driving voltage of a lower amount than the first driving voltage VDD, for example, a voltage of 0.5 V may be applied to the bit lines BL0 and BL2. At the same time, the word line of the adjacent other unselected memory cell transistors of the memory string SMS to which the selected memory cell transistor SM belongs is supplied with a positive pass voltage $V_{PASS\_1}$, for example, a voltage of 3.5 V, which is greater than the threshold voltage of the memory cell transistor in the case of logic "0". At the same time, a negative program voltage $V_{PGM}$, for example, −1 V, may be applied to the word line of the selected memory cell transistor SM. In this case, all the unselected memory cell transistors are in a turned-on state. As a result, the voltage VDD applied to the selected bit line may be applied to the second source/drain electrode $S/D_2$ of the selected memory cell transistor, and the first source/drain electrode $S/D_1$ may be grounded. A current by the GIDL mechanism is generated at the second source/drain electrode $S/D_2$ of the selected memory cell transistor, whereby a programming operation that the floating portion of the selected memory cell transistor SM is be charged with excessive holes may be performed.

In another embodiment, as shown in FIG. 6A, the word line of the lower memory cell transistors M8, M9 and M10 on the bit line BL1 side of the non-selected memory cell transistors M8 to M10 and M12-M15 of the memory string SMS to which the selected memory cell transistor SM belongs is supplied with a high-pass voltage VPASS_1 higher than the threshold voltage of the memory cell transistor in the case of logic of "0", for example, 3.5 V and the source line is grounded. Therefore, the word line of the upper memory cell transistors M12, M13, M14, and M15 on the source line side is supplied with a low pass voltage $_{V-PASS\_2}$, for example, 1.5 V, smaller than the high pass voltage$_{PASS\_1}$. As a result, the upper memory cell transistors M12, M13, M14, and M15 may be turned on. In this way, by applying a low-pass voltage$_{VPASS\_2}$ lower than the lower memory cell transistors to the upper memory cell transistors M12, M13, M14, and M15, it is possible to save power consumed in the entire programming operation. The values of the above-mentioned voltages are illustrative, and the present invention is not limited thereto.

The type of the voltage level may be simplified as much as possible in order to simplify the configuration of the peripheral circuit for driving the memory element. For example, the second driving voltage applied to the bit lines BL0, BL2 of the non-selected memory string USMS in the programming operation may be set to a suitable voltage, for example, 0.5 V, so that it may match the fourth driving voltage used in the reading operation, as described later.

Figure 7A:
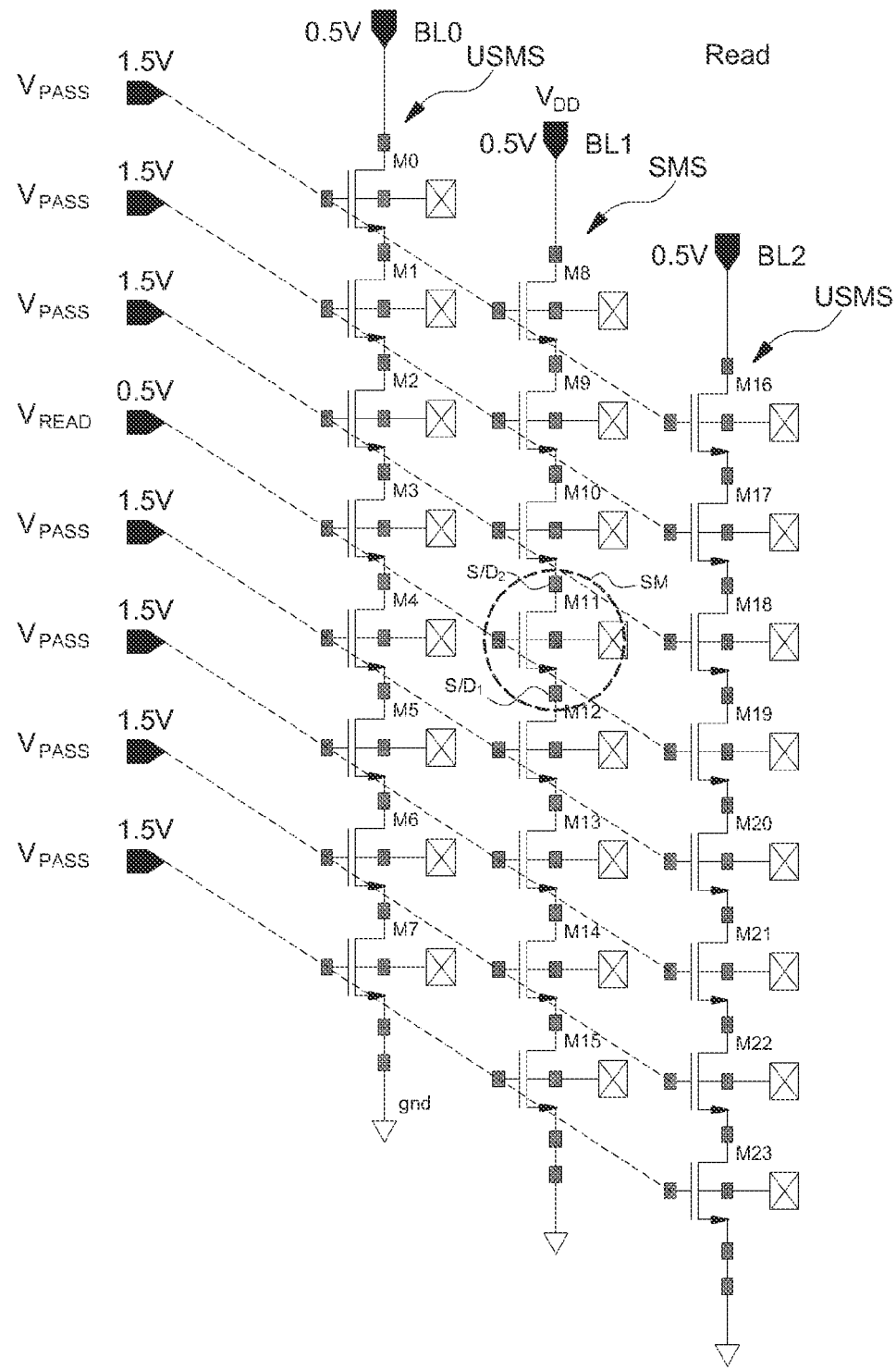
FIG. 7A and FIG. 7B are a circuit diagram illustrating a method of reading a memory cell transistor according to an embodiment of the present invention, and a graph illustrating I-V characteristics.
Figure 7B:
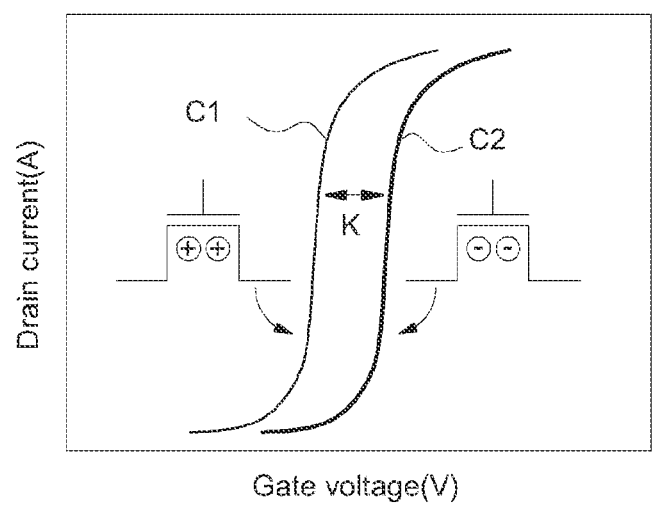

FIG. 7A and FIG. 7B are a circuit diagram illustrating a method of reading a memory cell transistor according to an embodiment of the present invention, and a graph illustrating I-V characteristics.

Referring to FIG. 7A, the reading operation is the process to determine whether the selected memory cell transistor SM is a logic "1" or "0", and to determine its threshold voltage. The bit line BL1 for the memory string SMS to which the selected memory cell transistor SM is supplied with a positive third driving voltage $V_{DD}$, for example, 0.5 V, and the bit lines BL0, BL2 of a non-elected memory string is grounded or the fourth driving voltage less than the third driving voltage $V_{DD}$ may be applied to the bit lines BL0, BL2. At the same time, the word lines for the non-selected memory cell transistors M8~M10, M12~M15 of the memory string SMS to which the selected memory cell transistor SM belongs is supplied with the second pass voltage $V_{PASS}$ larger than the threshold voltage of a memory cell transistor in case of a ground state or the logic "0". Furthermore, a positive reading voltage $V_{READ}$ (>0 V) may be applied to the word line of the selected memory cell transistor SM. In addition, a positive reading voltage $V_{READ}$ (>0V) may be applied to the word line of the selected memory cell transistor SM. A suitable voltage may be selected as the above reading voltage $V_{READ}$ in order to identify the threshold voltage of logic "1" and the threshold voltage of logic "0", and the voltage level corresponding to the operating voltage of the sense amplifier may be set. In one embodiment, the positive reading voltage $V_{READ}$ may have a voltage level between the threshold voltage of logic "1" and the threshold voltage of logic "0".

In the embodiment illustrated in FIG. 7, the feature that the same pass voltage is applied to the non-election word line regardless of the upper and lower memory cell transistors is illustrated, and the pass voltage may be a pass voltage of a low level, e.g. a second pass voltage at an programming operation, for example 1.5 V.

Referring to FIG. 7, if the memory cell transistor is programmed from logic "0" to logic "1", the I-V curve is shifted to the left side as shown by arrow K and much currents will flow in the case of logic "1" (curve C1), and a relatively smaller current will flow in the case of logic "0" (curve C2) in response to the same reading voltage, and thus, data may be detected from the selected memory cell transistor selected through the selected bit line.

Figure 8A:
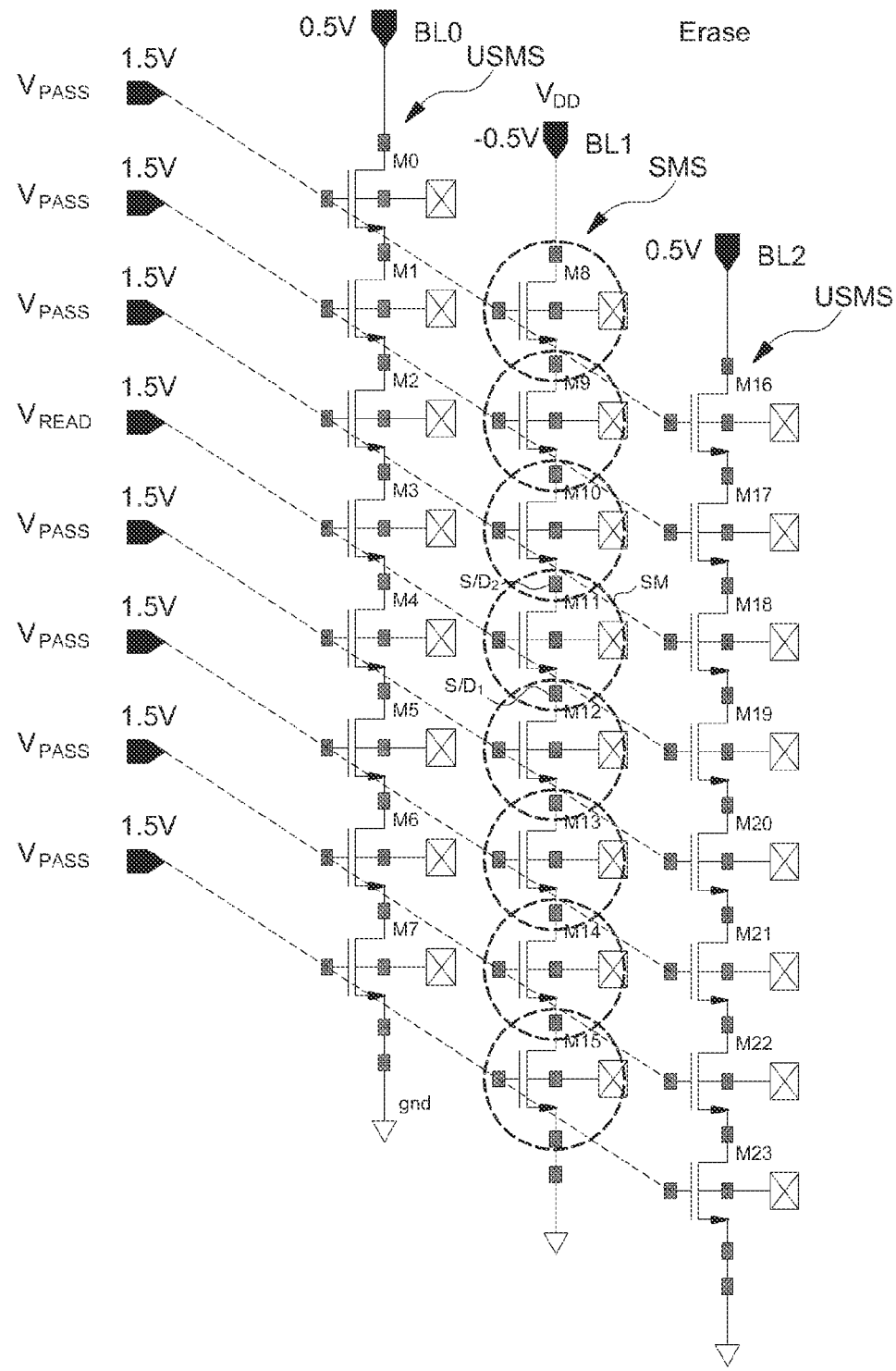
FIG. 8A is a circuit diagram illustrating a method of erasing a memory cell transistor according to an embodiment of the present invention.
Figure 8B:
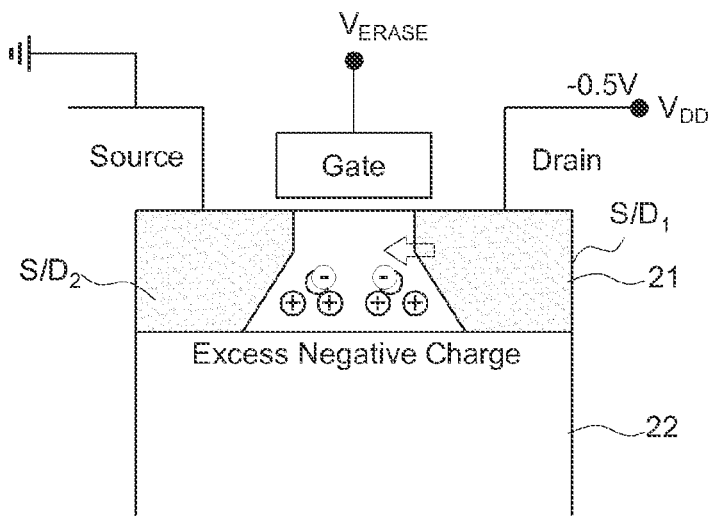
FIG. 8B is a cross-sectional diagram schematically illustrating an erasing operation of an erased memory cell transistor.

FIG. 8A is a circuit diagram illustrating a method of erasing a memory cell transistor according to an embodiment of the present invention, and FIG. 8B is a cross sectional diagram schematically explaining the erasing operation of erased memory cell transistors.

Referring FIG. 8A, in an erasing operation, a fifth negative driving voltage $V_{DD}$, for example, −0.5V may be applied to the bit line BL1 of the memory string SMS to which the selected memory cell transistor SM belongs, and the third pass voltage $V_{PASS}$, for example, 1.5V may be applied to all word lines. A sixth positive driving voltage, for example 0.5V, may be applied to the bit lines BL0, BL2 of a non-selected memory string USMS.

In this case, the selected memory string SMS will be subject to a uniform voltage drop from the Bit line BL1 to the source line. At this time, as shown in FIG. 8b, a forward bias is applied to the floating portion from the second source/drain electrode $SD_2$ of each memory cell transistor, and negative charges, i.e. electrons, are injected from the first source/drain electrode S1. Therefore, the charged state of the floating portion may be neutralized or may be charged into an opposite polarity, that is, a negative state due to excessive electrons. According to one embodiment of the present invention, an erasing operation is identically performed for all memory cell transistors of the memory string SMS to which the selected memory cell transistors belong, without any special options as indicated by the dotted circle. In this respect, this erasing operation of the present invention is distinguished from a conventional operation for erasing DRAM device, which selectively erases only the selected memory cell transistors selected. Also, an operation for recovering the data state of the non-selected memory cell transistor is required since the erasing operation is identically performed for other non-selected memory cell transistors along with the erasing operation of the selected memory cell transistor.

The voltage described with respect to the driving voltage and the pass voltage which are mentioned while referring to FIG. 6A and FIG. 8B is exemplary and the present invention is not limited to this. Also, as illustrated in the drawings, some of the driving voltages used during the programming stage, a reading stage, and an erasing stage may be identical and some of the pass voltages may be also identical. It may also simplify the configuration of the driver by making the values of some driving voltages and some pass voltages consistent.

Figure 9:
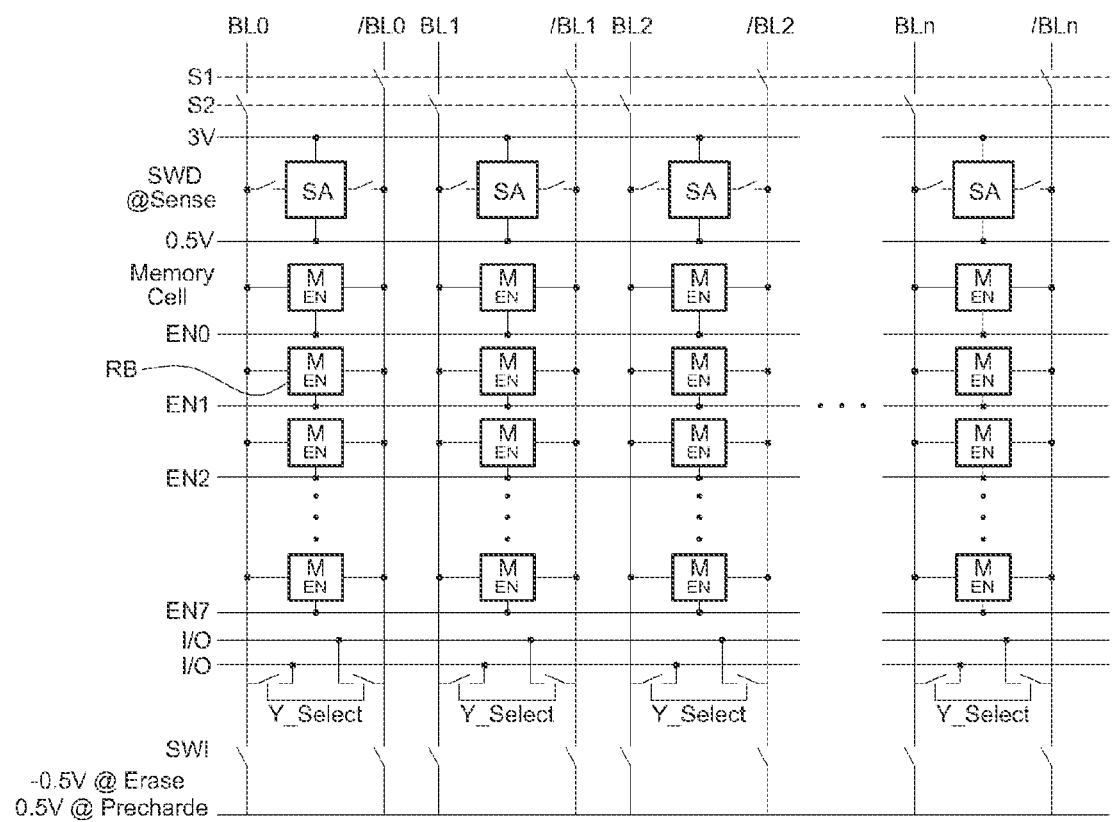
FIG. 9 is a circuit diagram illustrating a semiconductor memory device including a row buffer memory according to one embodiment of the present invention.

FIG. 9 is a circuit diagram illustrating a semiconductor memory device including a row buffer memory RBM according to one embodiment of the present invention.

Referring to FIG. 9, during the erasing operation of the selected memory cell transistor, the data status of the other selected memory cell transistors belonging to the same memory string will also be erased. Thus, a row buffer memory is required in order to back up the data status of each memory cell transistor. The number of the row buffer memory equal to the number of memory cells may be required. A correction operation includes an erasing operation and a programming operation, which may require a row buffer memory in the correction operation.

In another embodiment, as shown in FIG. 9, the memory element may have a folded. bit line structure wherein the first bit line BL, and the neighboring second bit line(/BL, also which is referred to as a reference bit line) with the first bit line BL is formed as a pair, so that the noise cancellation efficiency may be optimized through a parallel configuration connected to each of both ends of a sense amplifier.

In this case, as shown in FIG. 9. the row buffer memory RB may be shared between the memory cells corresponding to the first bit line BL and the second bit line /BL, respectively. In this case, the number of the row buffer memories RB may be ½ of the total number of memory cells. In one embodiment, the row buffer memory (RB) may implement a short-term data storage function and thus may have a simple DRAM structure. However, this is an exemplary case and the buffer memory may have an SRAM structure.

In one embodiment, the sense amplifier SA may have a circuit structure of a latch type. During the reading operation, the reference bit line should be pre-charged to a reference voltage, and the reference voltage may have a low threshold voltage of the sense amplifier. For example, the low threshold voltage may have a value of 0.5 V used to perform a reading operation of the sense amplifier, which may be adjusted in consideration of device characteristics depending on the memory cell transistor and/or the sense amplifier itself, and the present invention is not limited thereto. In one embodiment, an erasing operation of a memory cell transistor according to an embodiment of the present invention includes an step for accessing the memory cell transistors of the memory string to which the memory cell transistor belongs are accessed before the erasing operation of the selected memory cell transistor and a step for transcribing the logic states of each of corresponding memory cell transistors to the corresponding row buffer memory. Thereafter, an erasing operation or a correction operation may be performed on the entire memory string as described with reference to FIG. 8A and FIG. 5B. For example, a negative program voltage, for example, a voltage of −0.5 V may be applied to the erasing operation, and a switch controller circuit may be required, so that a pre-charge voltage, for example, a voltage distinguished from 0.5 V may be applied.

When the erasing operation or the correction operation for the entire memory string to which the selected memory cell belongs is completed for erasing or correcting the selected memory cell, the data state of the non-selected memory cell transistors is restored based on the data stored in the corresponding buffer memory. Such a data restoration may be achieved by sequentially performing the programming operation described with reference to FIGS. 6A and 6B for the non-selected memory cell transistors.

In the folded bit line structure, at least one or more selection lines S1, S2 may be provided for selection of the bit line. Further, the memory device may further include a wiring I/O and switch members SW0 and SW1 for transmitting input and output signals. The nodes indicated by dots show memory cell transistors. The illustrated folded bit line structure is exemplary, and the memory device of the present invention may have an open bit line structure which is very advantageous in terms of a space as described above, and the present invention is not limited thereto.

Figure 10:
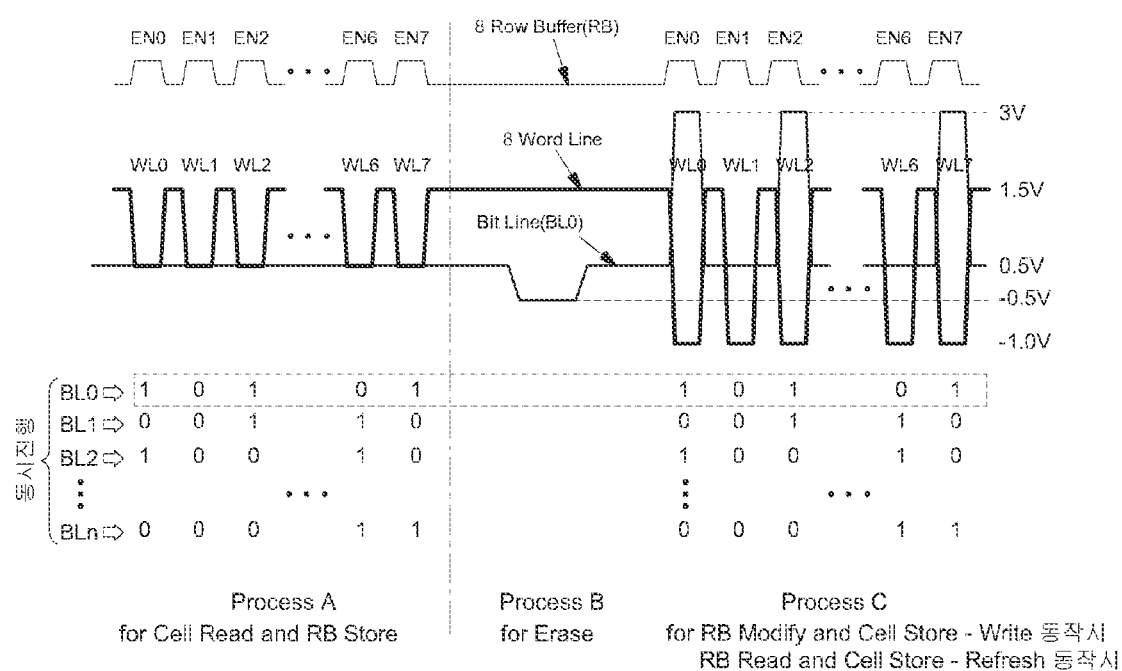
FIG. 10 is a waveform diagram for explaining a refresh operation of a semiconductor memory device according to an embodiment of the present invention.

FIG. 10 is a waveform diagram for explaining a refresh operation of a semiconductor memory device according to an embodiment of the present invention.

Referring to FIG. 10, in one embodiment, a refresh operation may be performed on a daily basis for all memory (or also referred to as a page) connected to, for example, eight word lines. The first step may include a step for reading a memory cell and a step for storing the read data of the memory cell in a row buffer memory as indicated by process A. In the first step, the voltage applied to the word line is sequentially reduced to the vicinity of the threshold voltage of the memory cell transistor, the current level difference is detected through the sense amplifier, and it is possible to back up the read data by enabling the row buffer memory allocated to the memory cell transistors M0-M7 of each of the word lines.

The second stage of the refresh operation may include an erasing operation, as indicated by process B. The second step may be performed simply by reducing all the bit lines to about −0.5 V at the same time. The third step of the refresh operation is to write the data stored in the row buffer memory back to the corresponding memory cell, as shown in process C. In this third step, if a negative program voltage VPGM capable of leading a GIDL to the word line, for example, −1.0V is applied and an appropriate driving voltage, for example, 3 V (when the logic is "1") or 0.5 V (when the logic is "0" is applied to the selected bit line according to the data of the row buffer memory, the refreshed data may be stored in each of the floating portions of the memory cell.

Since the first to third steps are performed simultaneously on all the bit lines BL0 to BLn, the time loss due to the refresh is not significantly different from that of a general DRAM memory device. As described above, when the refresh operation is completed for one area of memory cells, a refresh operation may be performed for memory cells in other areas. For example, when the refresh operation for one page is completed, the refresh operation may be repeated for another page in the same manner. Further, since the entire page data remains in the row buffer memory after the refresh operation, an additional operation of transferring the data of one page to another page may be realized by utilizing the above feature.

Figure 11:
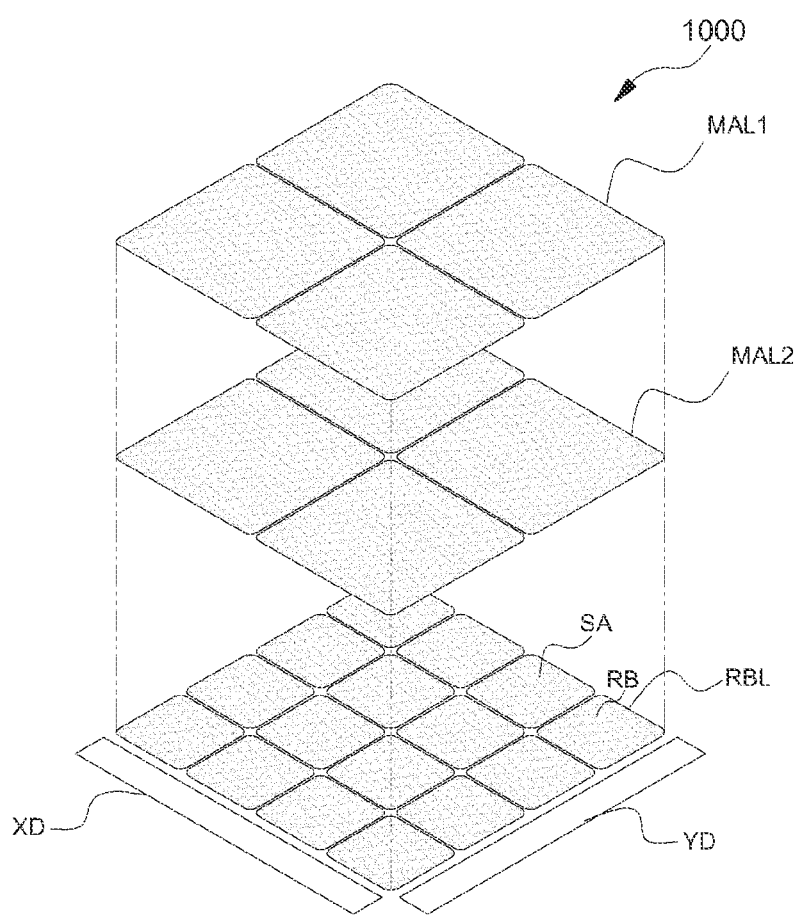
FIG. 11 is an exploded perspective diagram illustrating a three-dimensional architecture of a semiconductor memory device including a row buffer memory according to an embodiment of the present invention.

FIG. 11 is an exploded perspective diagram illustrating a three-dimensional architecture of a semiconductor memory device 1000 including a row buffer memory RB according to an embodiment of the present invention.

Referring to FIG. 11, the semiconductor memory device 1000 may include at least more than one memory layer MAL1, MAL2 including an array of memory cells according to an embodiment of the present invention. If the row buffer memory layer RBL is required by the number of memory cells of the memory string, a large available area is required for providing the sense amplifier SA together with the row buffer memory RB. In order to solve this problem, in one embodiment, the semiconductor memory device 1000 may have a structure in which the memory cell arrays MAL1 and MAL2 and the row butler memory layer RBL are separated from each other. For example, a GUA (CMOS Under Array) and/or a PUC (Peri Under Cell) architecture may be employed in which the row buffer memory layer RBL is disposed at the bottom of the memory cell arrays MAL1 and MAL2. In this case, a chip size may be reduced as compared with s process for forming the row butler memory RB and the memory cell arrays MAL1 and MAL2 on one plane, and the reduced area increases the size margin of other peripheral circuits such as a sense amplifier SA, thereby securing a large area for a row buffer memory RB and a sense amplifier SA.

A row decoder XD, a column decoder YD, a read/write circuit (not shown) and control logic (not shown) for controlling them are formed on a substrate, and a row buffer memory layer RBL is formed thereon. The DRAM memory element layers MAL1 and MAL2 according to the embodiments of the present invention may be formed on the row buffer memory layer RBL.

FIG. 12A-FIG. 12I are cross-sectional diagrams sequentially illustrating a method of fabricating a semiconductor memory device according to an embodiment of the present invention, and FIG. 13A-13I are plan diagrams corresponding to respective cross-sectional diagrams of FIG. 12A to FIG. 12I.

Figure 12A:
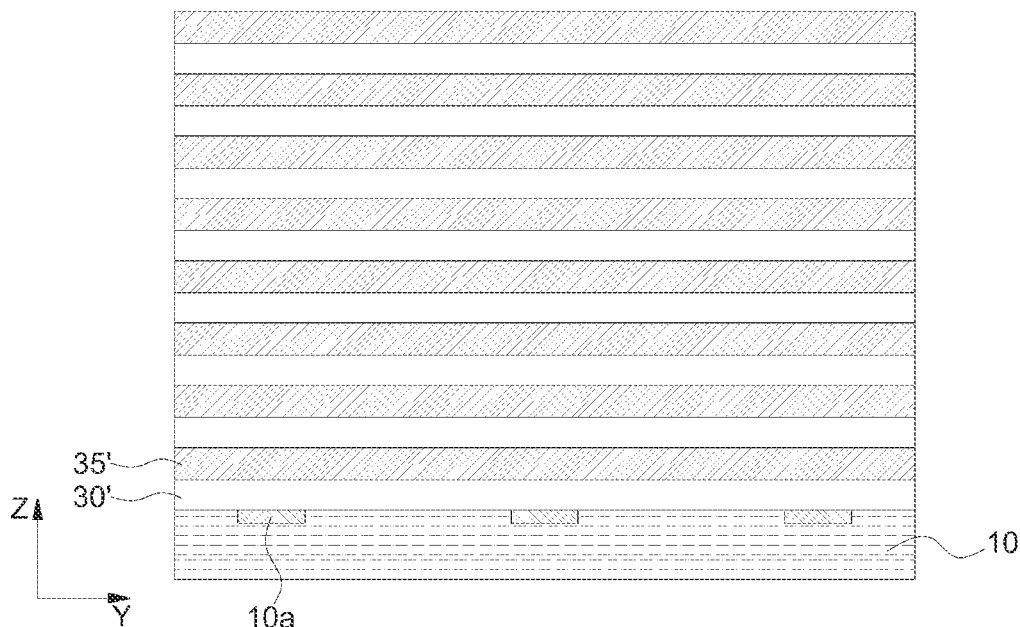
FIG. 12A-FIG. 12I are cross-sectional diagrams sequentially illustrating a method of fabricating a semiconductor memory device according to an embodiment of the present invention.
Figure 13A:
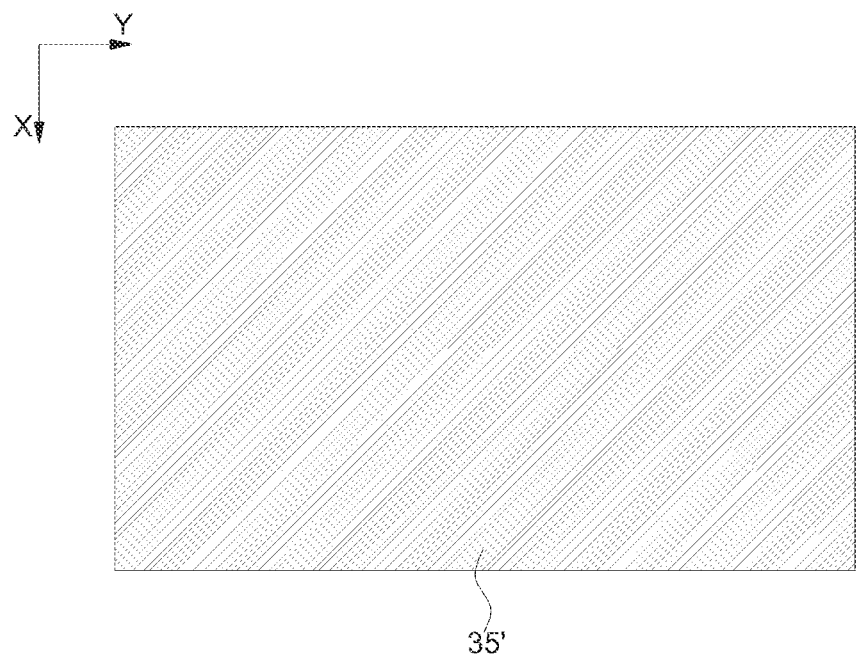
FIGS. 13A-13I are plan diagrams corresponding to respective cross-sectional diagrams of FIG. 12A to FIG. 12I.

Referring to FIG. 12A and FIG. 13A, first of all, a substrate 10 is provided. An impurity region 10*a* or wiring for forming a source line may be formed on the substrate 10. Alternatively, various driving elements including transistors or the above-described row buffer memory may be formed. In another embodiment, the substrate 10 may be any structure for forming another package stacking frame, such as an interposer substrate or a lead frame.

The impurity-containing insulating layer 30' and the sacrificial layer 35' are alternately repeatedly laminated on the substrate 10. The number of times of repeated stacking may be determined in consideration of the number of stages of memory cells, the number of selected transistors, and the number of ground transistors.

In one embodiment, as the impurity-containing insulating layer 30' functions as an impurity source for forming the first and second source/drain electrodes on the common semiconductor layer of the underlying film, as described later, the impurity-containing insulating layer 30' includes a dopant as an impurity for forming the first and the second source/drain electrodes. For example, when the first and second source/drain electrodes are n-type, the impurity-containing insulating layer 30' may include an insulator matrix such as silicon oxide or silicon nitride, and dopant elements of Group 2 or Group 3, Group 5 or Group 7 contained in the insulator matrix as the impurity. For example, the dopant element of Group 2 dopant element may include zinc or cadmium, the dopant element of the Group 3 may include boron, and gallium, or indium, the dopant element of Group 5 may be phosphorus, and the dopant element of the Group 7 may be fluorine. The impurities may be physically dispersed in the insulator matrix or may be chemically combined to the material for forming the insulator matrix. Alternatively, the impurities may be physically or chemically adsorbed or coated on the surface of the insulator matrix, but the present invention is not limited thereto. In one embodiment, the impurity-containing insulating layer 30' may include a material such as phosphoric silicate glass PSG.

The sacrificial layer 35' may be formed of a material having an etching selectivity with the impurity-containing the insulating film 30'. For example, when the impurity-containing insulating layer 30' is a silicon oxide-based material, the sacrificial layer 35' may be silicon nitride. The thicknesses of the impurity-containing insulating layer 30' and the sacrificial layer 35' may be determined in consideration of the interval between the memory cells and the width of the gate electrode.

Figure 12B:
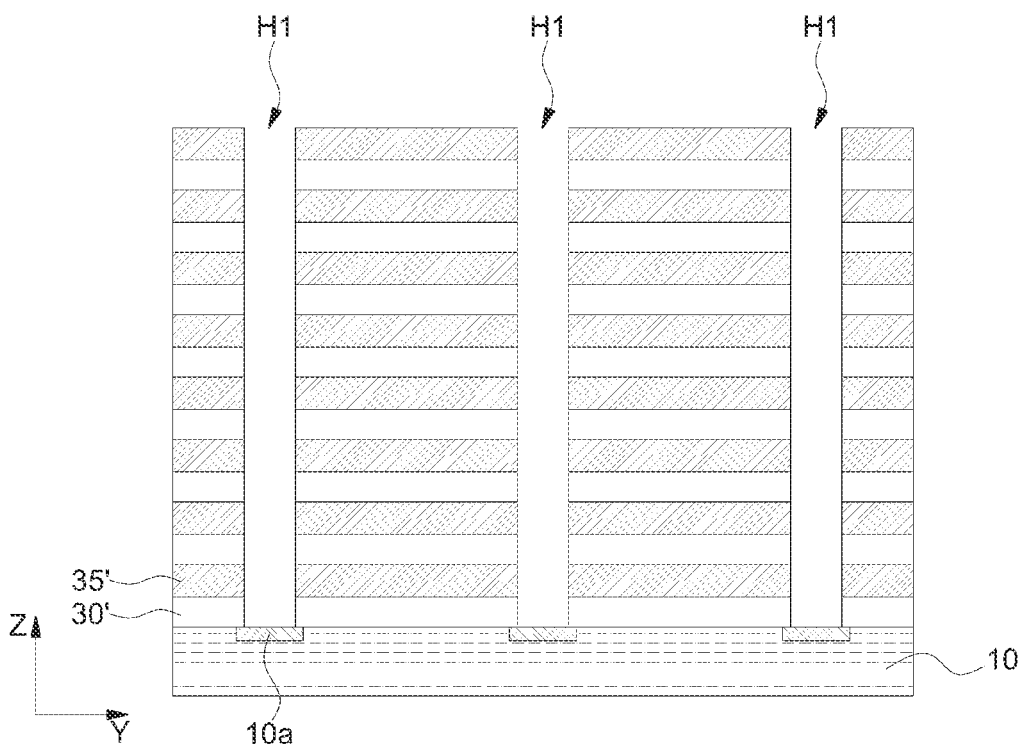
Figure 13B:
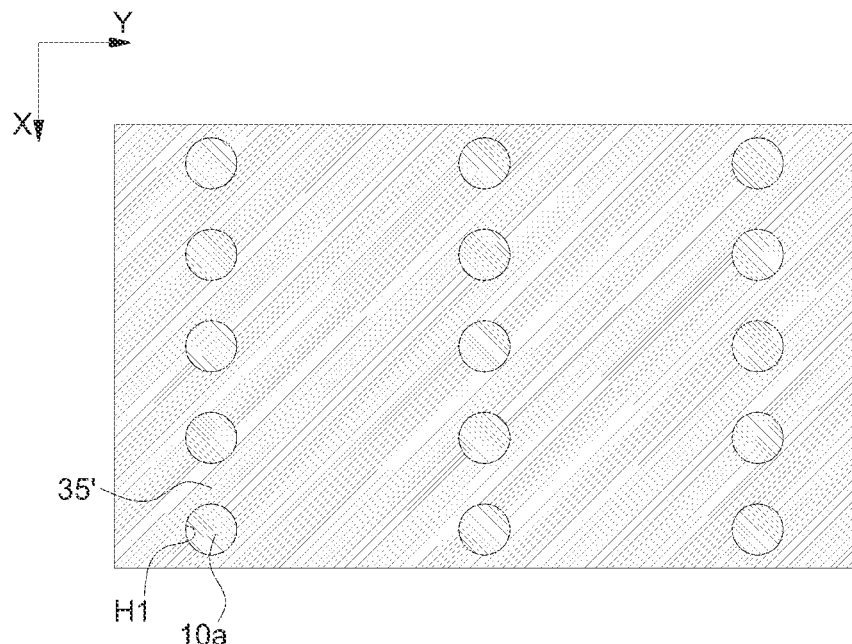

Referring to FIG. 12B and FIG. 13B, thereafter, first holes H1 are formed through the stack of the impurity-containing insulating layer 30' and the sacrificial layer 35' repeatedly laminated in the vertical direction. The cross-sectional shape of the first holes H1 may have any shape such as an arc or an ellipse in consideration of the profile of the electric field of the gate electrode of the GAA type on the channel layer, and the present invention is not limited thereto.

Figure 12C:
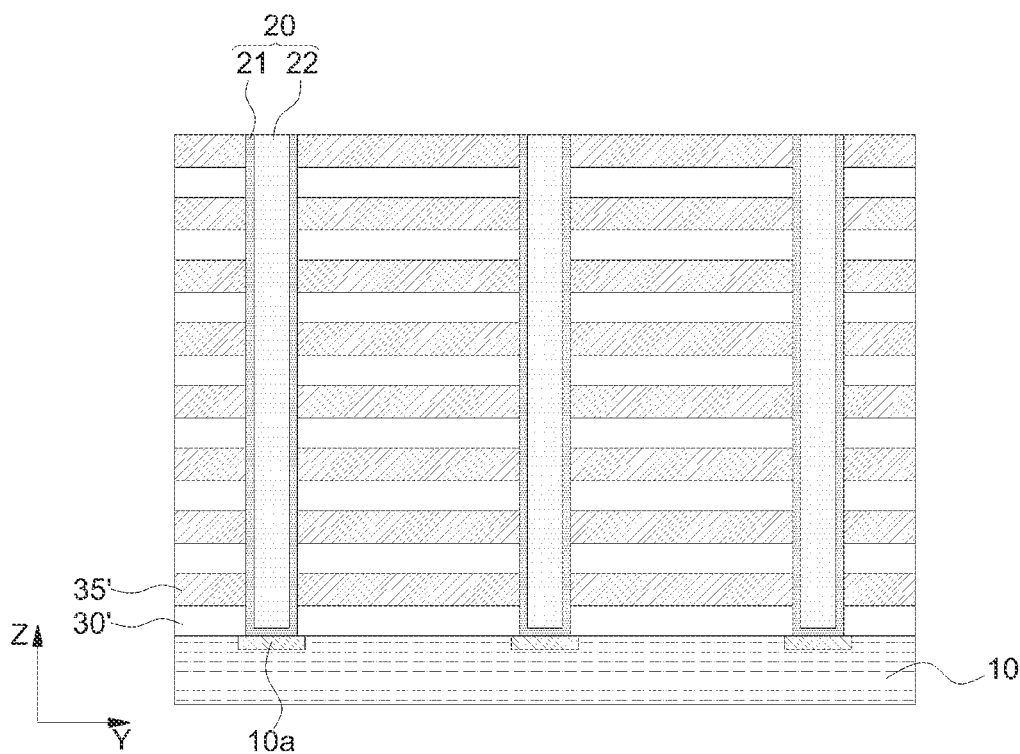
Figure 13C:
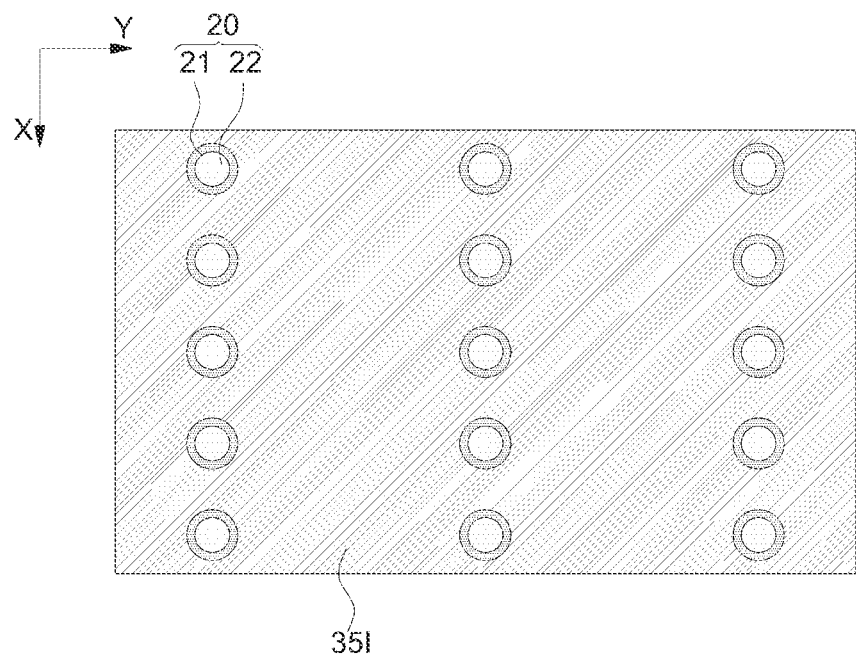

Referring to FIG. 12C and FIG. 13C, the semiconductor pillars 20 are formed in each of the first holes H1. The semiconductor layer 21 is formed in the first holes H1 through a thin film forming process and then, the semiconductor pillars 20 may be provided by filling the second holes (not shown) defined by the semiconductor layer 21 with the core insulator 22. The bottom of the semiconductor layer 21 may be formed in contact with the substrate 10 and as a result, may be electrically connected to a source line formed on the substrate 10.

The semiconductor layer 21 may include at least a part of polycrystalline silicon or epitaxially grown silicon single crystal. In addition, the semiconductor layer 21 may have a stacked structure of at least two or more semiconductor layers such as a silicon layer/a germanium layer, but the present invention is not limited thereto.

For example, the semiconductor layer 21 may include a two-dimensional material, an oxide semiconductor, or a compound semiconductor, but the present invention is not limited thereto. In one embodiment, a trap member for guiding the charge trap may be further formed to extend the time of leakage of electrons or holes charged into the floating portion or to increase the charging efficiency. The trap member may be formed with or separately from the semiconductor layer 21, but the present invention is not limited thereto. For example, a crystal grain of a semiconductor material, a defect structure, a dispersed nanocrystal, a two-dimensional material such as graph an insulator thin film such as a silicon nitride layer, or a combination thereof may be formed in at least floating portion of the semiconductor layer 21. The trap member may provide any energy level for trapping charges transferred from the source/drain regions, and the present invention is not limited to the above-described examples.

The thin film forming process for forming the semiconductor layer 21 may be chemical vapor deposition or atomic layer deposition with high step coverage. The semiconductor layer 21 provides a common semiconductor layer forming a channel layer of the memory string.

The core insulator 22 may be formed of, for example, silicon oxide having an etching selectivity with the sacrificial layer 35'. As described above with referring to FIG. 2B, the semiconductor pillars 20 are vertically aligned with the substrate 10. As another example, the semiconductor pillars 20 may have a U-shape, such as a widely-known Piped BiCs (P-BicS) structure. In addition, a semiconductor column made of only the solid semiconductor layer having a filled inside without the core insulator 22 may be provided.

Figure 12D:
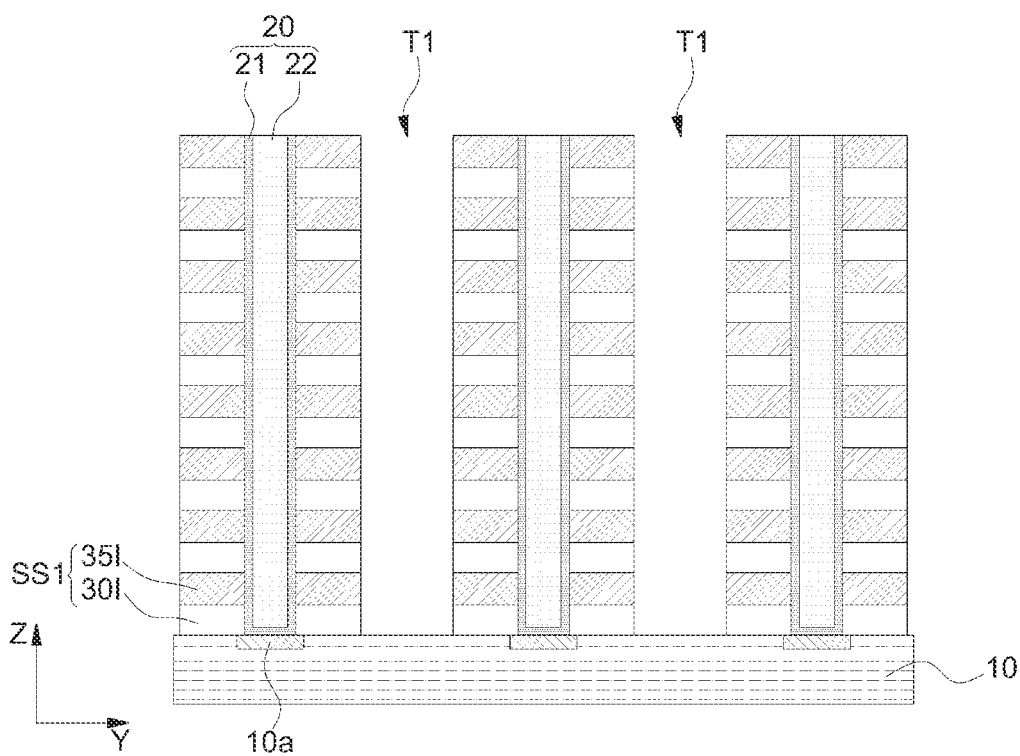
Figure 13D:
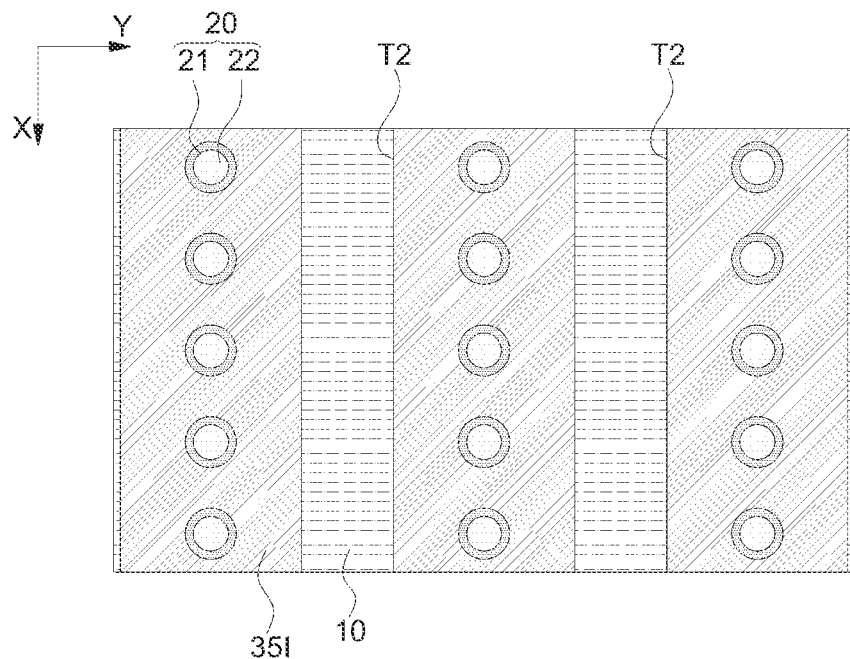

Referring to FIG. 12D and FIG. 13D, in connection with the substrate 10 on which the semiconductor pillars 20 are formed, a first trench region T1 is formed in the direction (Z direction) vertically extended to the first direction (X direction). The first trench region T1 separates the semiconductor pillars 20 aligned in the second direction (Y direction), thereby forming a stacked structure SS1 of the impurity-containing insulating layer pattern 30I and the sacrificial layer pattern 35I Is formed.

The first, trench region T1 separates the semiconductor pillars 20 aligned in the second direction (Y direction), thereby forming a stacked structure SS1 of the impurity-containing insulating layer pattern 30I and the sacrificial layer pattern 35I.

Figure 12E:
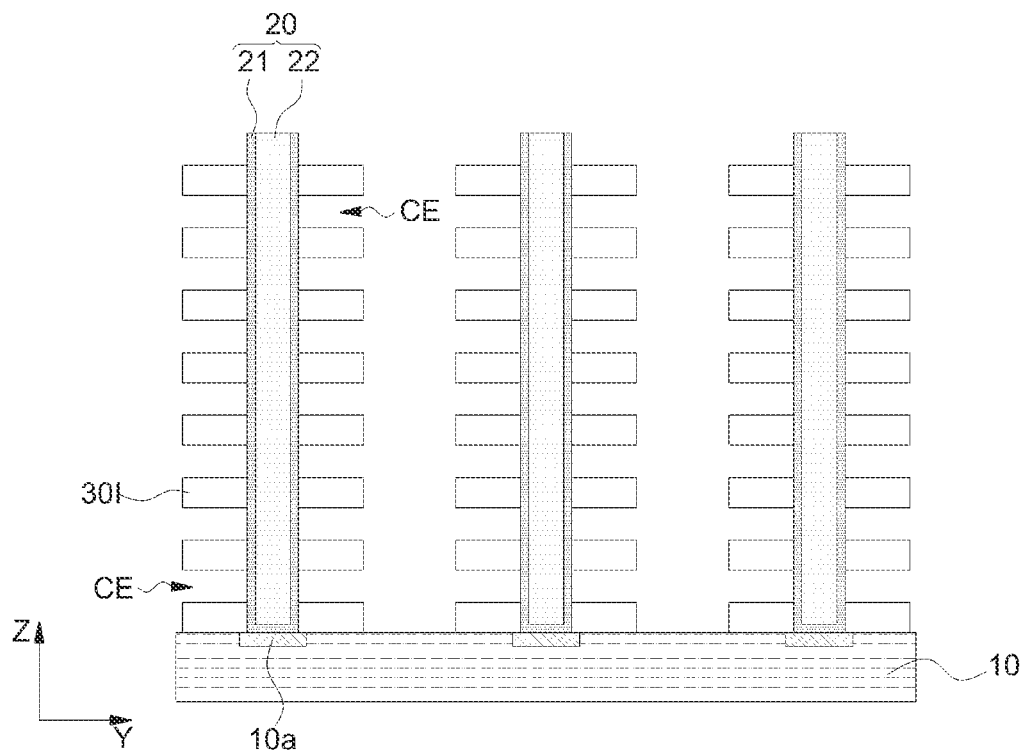
Figure 13E:
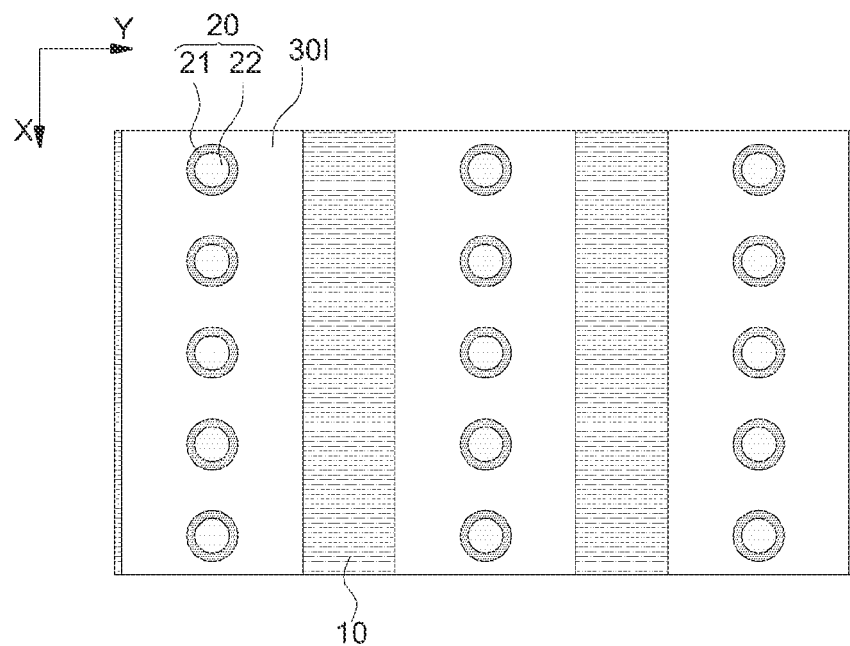

Referring to FIG. 12E and FIG. 13E, the sacrificial layer pattern 35I may be removed from the laminated structure SS1 of the impurity-containing insulating layer pattern 30I and the sacrificial layer pattern 35I exposed through the first trench region T1. At this time, only the sacrificial layer pattern 35I may be selectively removed using the etching selectivity of the sacrificial layer pattern 35I and the impurity-containing insulating layer pattern 30I. As a result, the cell spaces CE that expose the sidewalk of the semiconductor pillars 20 and the surface of the semiconductor layer 21 may be formed between the stacked impurity-containing insulating layer patterns 30I.

Figure 12F:
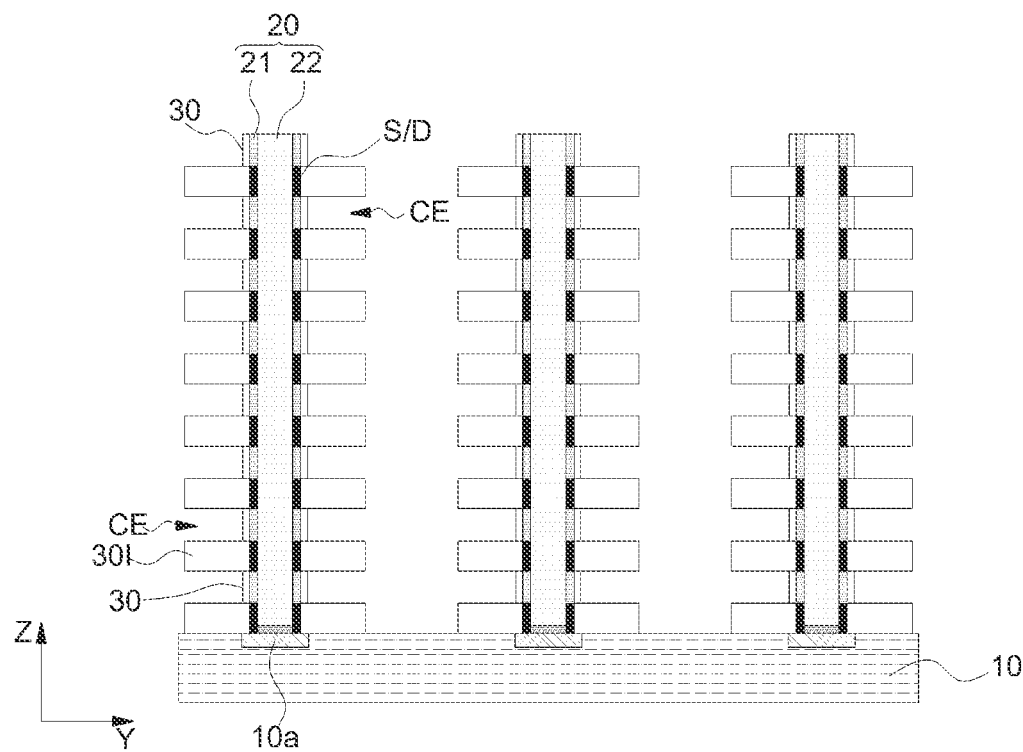
Figure 12G:
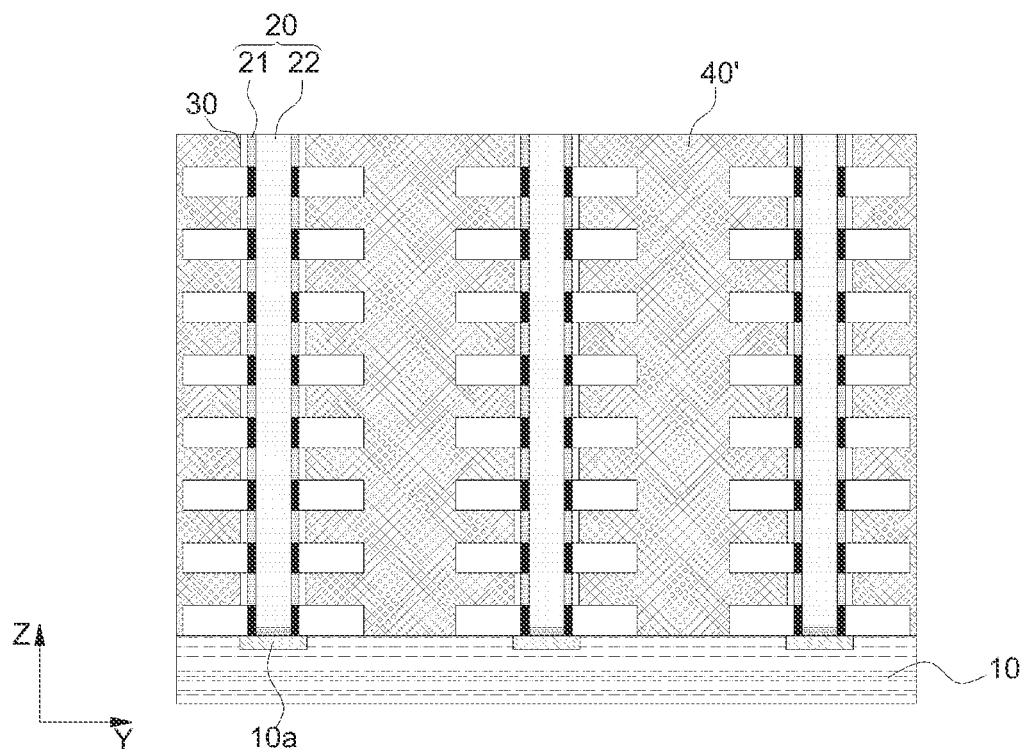
Figure 13F:
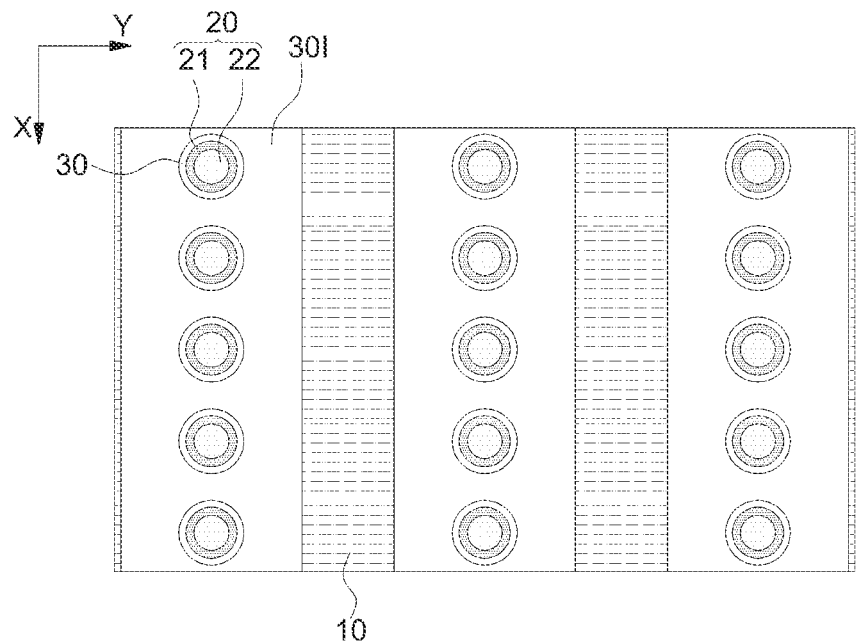
Figure 13G:
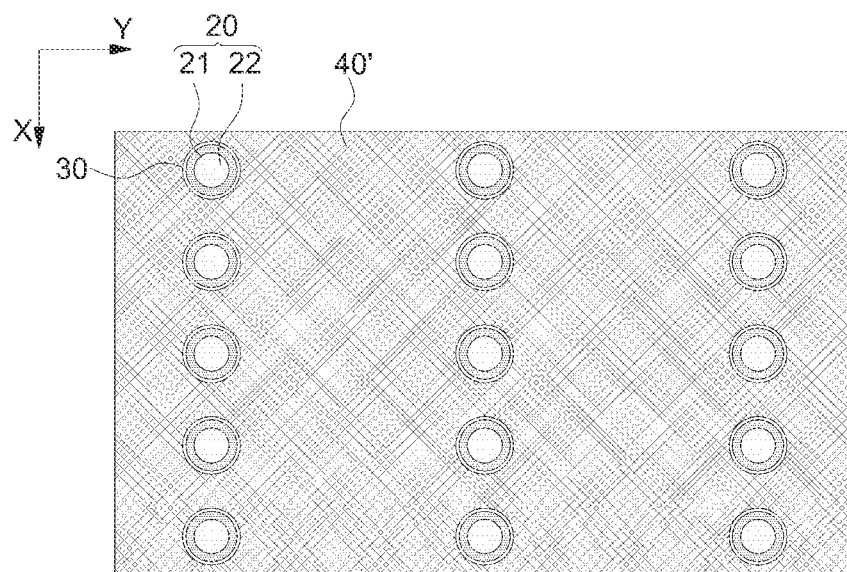

Referring to FIG. 12F and FIG. 13F, a heat treatment is performed on the substrate 10 on which the cell spaces CE are formed. The heat treatment may be performed in an oxidizing atmosphere such as $O_2$ or $O_3$. On the surface of the semiconductor layer 21 exposed through the cell spaces (CE) through the heat treatment, a gate insulating film 30 is formed via a thermal oxidation process. At the same time when the gate insulating film 30 is formed, the impurities contained in the impurity-containing insulating layer pattern (30I) are thermally diffused to the area of the semiconductor layer 21 adjacent to the impurity-containing insulating layer pattern (30I). A region of the semiconductor layer 21 under the impurity-containing insulating layer pattern (30I) is locally doped and thus, a source/drain region S/D may be formed. In this manner, according to an embodiment of the present invention, there is an advantage that the gate insulating film 30 and the source/drain region S/D may be formed at the same time over the plurality of memory strings via a single heat treatment Referring to FIG. 12G and FIG. 13G, a conductive film 40' filling at least a part of the cell spaces CE, in which the gate insulating film 30 is formed, is formed. The conductive film 40' may have a single conductive film such as titanium nitride, polycrystalline silicon, tungsten, or aluminum or a laminated structure of two or more such as a titanium nitride film TiN/tungsten W. The present invention is not limited thereto.

Figure 12H:
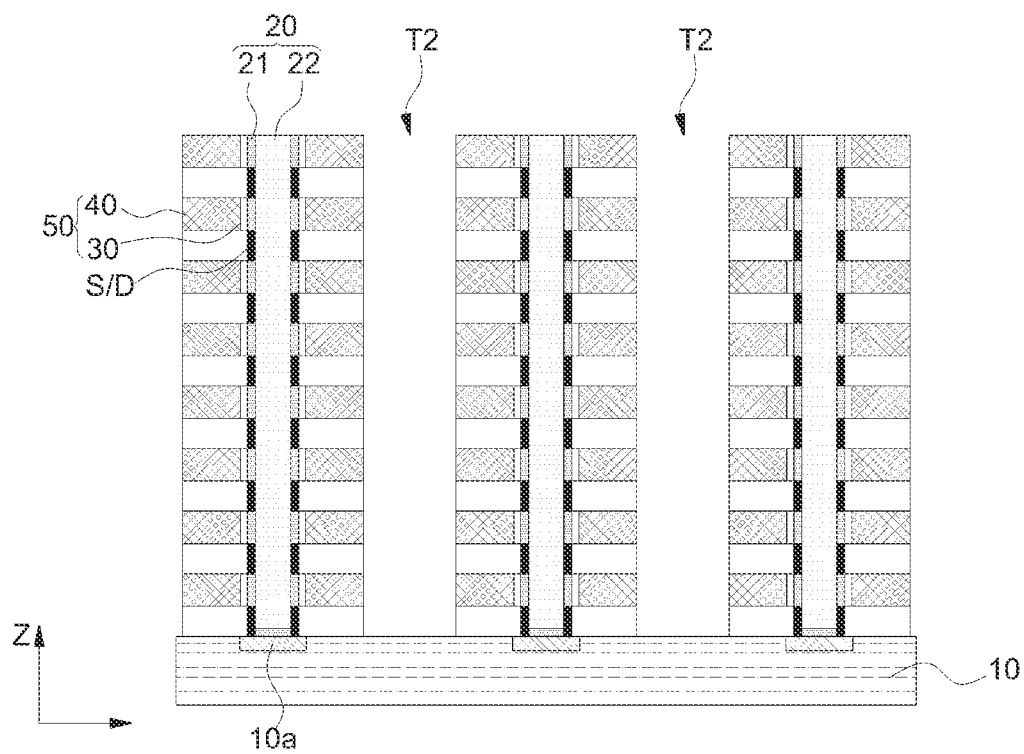
Figure 12I:
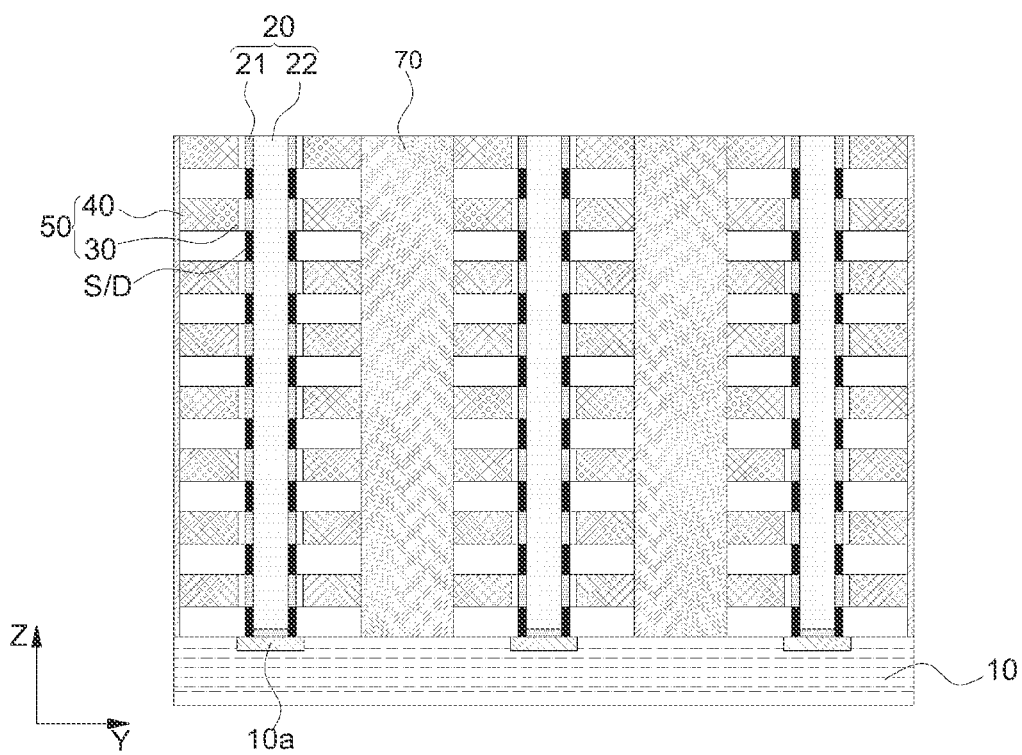
Figure 13H:
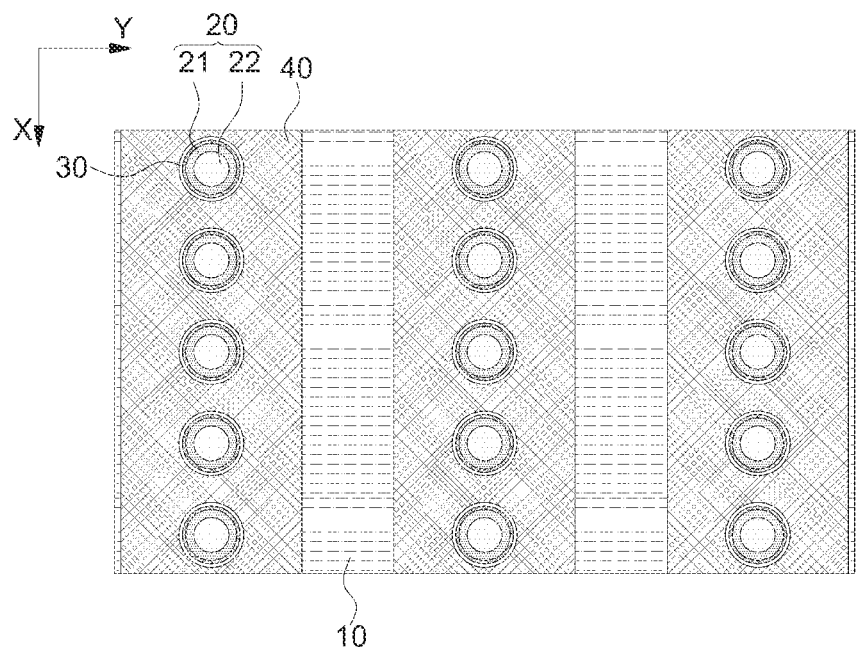
Figure 13I:
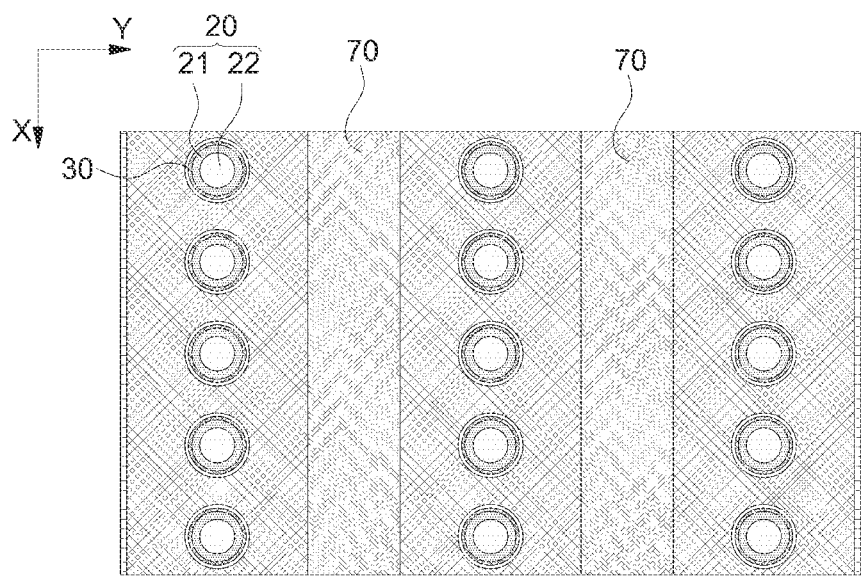

Referring to FIG. 12H and FIG. 13H, a second trench region T2 extended in the first direction (X direction) and the vertical direction (Z direction) is formed on the substrate 10 on which the conductive film 40' is formed. Then, referring to FIG. 12I and FIG. 13I, an electrical isolation between the memory strings in the second direction (Y direction) may be achieved via the element isolation film 70 filling the second trench region T2. Thereafter, a process for forming an electrical wiring is performed, so that the electrical wiring such as the bit line may come into contact with the exposed end of the interlayer insulating film and the memory string. Consequently, the semiconductor memory device may be manufactured by the process for forming an electrical wiring.

The present invention described as above is not limited to the above-described embodiments and the accompanying drawings. It will be apparent to those skilled in the art that various substitutions, modifications and variations can be made in the present invention without departing from the spirit or scope of the invention as defined in the appended claims.

What is claimed is:

1. A method of driving a semiconductor memory device comprising,
    memory strings, each of the memory strings including a plurality of memory cell transistors which are connected in series and having a floating portion;
    word lines coupled to a gate electrode of each of the plurality of memory cell transistors;
    bit lines connected to one end of each of the memory strings;
    source lines connected to other end of each of the memory strings;
    a row decoder electrically connected to the plurality of memory cell transistors through the word lines; and
    a column decoder electrically coupled to the plurality of memory cell transistors through the bit line,
    the method comprising,
    a programming step including a step for applying a first driving voltage to a selected bit line, and applying a second driving voltage less than the first driving voltage to non-selected bit lines or grounding the non-selected bit lines; and a step for applying a program voltage to the selected word line and applying a first pass voltage to the unselected word lines; and
    a reading step including a step for applying a third driving voltage to the selected bit line and applying a fourth driving voltage to the non-selected bit lines or grounding the non-selected bit lines; and a step for applying a reading voltage to the selected word line and applying a second pass voltage to the unselected word lines.

2. The method of driving a semiconductor memory device according to claim 1, wherein in the programming step, the first pass voltage includes a high-pass voltage applied to the word lines on the selected bit line side among the non-selected word lines, and a low-pass voltage smaller than the high-pass voltage applied to the word lines on the source line side of the unselected word lines.

3. The method of driving a semiconductor memory device according to claim 1, wherein in the reading step, the third driving voltage and the fourth driving voltage are identical to each other or the fourth driving voltage is less than the third driving voltage.

4. The method of driving a semiconductor memory device according to claim 1, wherein the second driving voltage and the fourth driving voltage are identical to each other.

5. The method of driving a semiconductor memory device according to claim 1, wherein in the programming step, the floating portion is charged by the GIDL mechanism.

6. The method of driving a semiconductor memory device according to claim 1, further comprising an erasing step including a step for applying a fifth negative driving voltage to the selected bit line and applying a sixth positive driving voltage to the unselected bit lines; and a step for applying a third pass voltage to all the word lines.

7. The method of driving a semiconductor memory device according to claim 6, wherein the third pass voltage is identical to the first pass voltage or the second pass voltage.

8. The method of driving a semiconductor memory device according to claim 6, further comprising a step for backing up data state of the non-selected memory cell transistor belonging to the selected memory string prior to the erasing step.

9. The method of driving a semiconductor memory device according to claim 6, wherein the step for backing up data state is performed by a row buffer memory.

10. The method of driving a semiconductor memory device according to claim 1, further comprising a refresh step of reading data state of the memory cell transistors at a predetermined period and then programming the memory cell transistors.

* * * * *